United States Patent
Hong et al.

(10) Patent No.: US 10,319,735 B2
(45) Date of Patent: Jun. 11, 2019

(54) METHOD FOR MANUFACTURING SEMICONDUCTOR DEVICE

(71) Applicant: SAMSUNG ELECTRONICS CO., LTD., Suwon-si, Gyeonggi-do (KR)

(72) Inventors: Suk Koo Hong, Seongnam-si (KR); Miyeong Kang, Incheon (KR); Hyosung Lee, Hwaseong-si (KR); Kyoungyong Cho, Namyangju-si (KR); Bora Kim, Suwon-si (KR); Hyeji Kim, Seoul (KR); Sunkak Jo, Ansan-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/455,667

(22) Filed: Mar. 10, 2017

(65) Prior Publication Data
US 2017/0186768 A1    Jun. 29, 2017

Related U.S. Application Data

(63) Continuation-in-part of application No. 15/205,196, filed on Jul. 8, 2016.

(30) Foreign Application Priority Data

Sep. 10, 2015 (KR) ..................... 10-2015-0128489

(51) Int. Cl.
| | |
|---|---|
| *H01L 21/311* | (2006.01) |
| *H01L 27/11582* | (2017.01) |
| *H01L 21/28* | (2006.01) |
| *H01L 27/11556* | (2017.01) |
| *G03F 7/039* | (2006.01) |
| *G03F 7/075* | (2006.01) |
| *G03F 7/09* | (2006.01) |
| *H01L 21/027* | (2006.01) |
| *H01L 27/11565* | (2017.01) |
| *H01L 27/1157* | (2017.01) |
| *H01L 27/11573* | (2017.01) |
| *H01L 27/11575* | (2017.01) |

(52) U.S. Cl.
CPC ...... *H01L 27/11582* (2013.01); *G03F 7/0392* (2013.01); *G03F 7/0397* (2013.01); *G03F 7/0757* (2013.01); *G03F 7/094* (2013.01); *H01L 21/0271* (2013.01); *H01L 21/28273* (2013.01); *H01L 21/28282* (2013.01); *H01L 21/31133* (2013.01); *H01L 21/31144* (2013.01); *H01L 27/1157* (2013.01); *H01L 27/11556* (2013.01); *H01L 27/11565* (2013.01); *H01L 27/11573* (2013.01); *H01L 27/11575* (2013.01)

(58) Field of Classification Search
CPC ..... G03F 7/075; G03F 7/094; H01L 21/3083; H01L 21/0274; H01L 21/31133
USPC ................................ 430/316, 317
See application file for complete search history.

(56) References Cited

U.S. PATENT DOCUMENTS

| | | |
|---|---|---|
| 6,368,982 B1 | 4/2002 | Yu |
| 7,122,455 B1 | 10/2006 | Lyons et al. |
| 7,303,855 B2 | 12/2007 | Hatakeyama et al. |
| 7,786,020 B1 | 8/2010 | Kang et al. |
| 8,437,192 B2 | 5/2013 | Lung et al. |
| 8,569,182 B2 | 10/2013 | Park et al. |
| 8,581,323 B2 | 11/2013 | Uenaka et al. |
| 8,659,946 B2 | 2/2014 | Jin et al. |
| 8,704,288 B2 | 4/2014 | Lee et al. |
| 8,728,889 B2 | 5/2014 | Lee et al. |
| 8,748,970 B1 | 6/2014 | Lee et al. |
| 8,791,523 B2 | 7/2014 | Iino et al. |
| 8,847,302 B2 | 9/2014 | Alsmeier et al. |
| 8,912,593 B2 | 12/2014 | Matsuda |
| 8,928,149 B2 | 1/2015 | Chen |
| 8,999,844 B2 | 4/2015 | Freeman et al. |
| 9,048,193 B2 | 6/2015 | Oh et al. |
| 9,087,738 B2 | 7/2015 | Park et al. |
| 9,214,569 B2 | 12/2015 | Kim et al. |
| 2004/0241579 A1* | 12/2004 | Hamada ............ G03F 7/0045 430/270.1 |
| 2006/0234156 A1* | 10/2006 | Kishioka ............ C08G 59/40 430/270.1 |
| 2013/0043509 A1 | 2/2013 | Cho et al. |
| 2014/0057429 A1* | 2/2014 | Oh .............. H01L 21/308 438/613 |
| 2014/0162420 A1 | 6/2014 | Oh et al. |
| 2014/0197470 A1 | 7/2014 | Lee et al. |
| 2014/0329379 A1 | 11/2014 | Kim et al. |

(Continued)

FOREIGN PATENT DOCUMENTS

| | | |
|---|---|---|
| JP | 2011142276 | 7/2011 |
| KR | 1020110001691 | 1/2011 |

(Continued)

OTHER PUBLICATIONS

Co-Pending U.S. Appl. No. 15/205,196, filed Jul. 8, 2016.

*Primary Examiner* — Daborah Chacko-Davis
(74) *Attorney, Agent, or Firm* — F. Chau & Associates, LLC

(57) ABSTRACT

Embodiments of the inventive concept provide a method for manufacturing a semiconductor device. The method includes forming a stack structure by alternately and repeatedly stacking insulating layers and sacrificial layers on a substrate, sequentially forming a first lower layer and a first photoresist pattern on the stack structure, etching the first lower layer using the first photoresist pattern as an etch mask to form a first lower pattern. A first part of the stack structure is etched to form a stepwise structure using the first lower pattern as an etch mask. The first lower layer includes a novolac-based organic polymer, and the first photoresist pattern includes a polymer including silicon.

20 Claims, 26 Drawing Sheets

(56) References Cited

U.S. PATENT DOCUMENTS

2015/0104945 A1 4/2015 Koh et al.
2015/0185614 A1 7/2015 Sim et al.

FOREIGN PATENT DOCUMENTS

KR  1020110119896  11/2011
KR  1020120053331   5/2012

\* cited by examiner

METHOD FOR MANUFACTURING SEMICONDUCTOR DEVICE

CROSS-REFERENCE TO RELATED APPLICATION

This U.S. non-provisional patent application is a Continuation-in-Part of U.S. patent application Ser. No. 15/205,196, filed on Jul. 8, 2016, in the U.S. Patent and Trademark Office, which claims priority under 35 U.S.C. § 119 to Korean Patent Application No. 10-2015-0128489, filed on Sep. 10, 2015, in the Korean Intellectual Property Office, the disclosure of which is incorporated by reference herein in its entirety.

TECHNICAL FIELD

Exemplary embodiments of the present inventive concept relate to a semiconductor device, and more particularly to a method for manufacturing a semiconductor device.

DISCUSSION OF RELATED ART

Semiconductor devices have been highly integrated and may provide high performance and low costs. The integration density of semiconductor devices may affect the costs of the semiconductor devices. An integration density of a two-dimensional (2D) or planar memory device may be mainly determined by an area where a unit memory cell occupies. Thus, the integration density of the 2D memory device may be affected by a technique of forming fine patterns. However, since relatively high-priced apparatuses may be used to form fine patterns, manufacturing capacity of relatively high density 2D memory devices may be limited.

Three-dimensional (3D) semiconductor devices including three-dimensionally arranged memory cells have been developed to increase integration density. However, production of 3D semiconductor memory devices may be relatively expensive and more complex as compared with 2D semiconductor memory.

SUMMARY

Exemplary embodiments of the present inventive concept may provide a method for manufacturing a semiconductor device using a bi-layer process of a photoresist pattern and a lower layer.

According to an exemplary embodiment of the present inventive concept, a method for manufacturing a semiconductor device includes forming a stack structure by alternately and repeatedly stacking insulating layers and sacrificial layers on a substrate, sequentially forming a first lower layer and a first photoresist pattern on the stack structure, etching the first lower layer using the first photoresist pattern as an etch mask to form a first lower pattern. A first part of the stack structure is etched to form a stepwise structure using the first lower pattern as an etch mask. The first lower layer includes a novolac-based organic polymer, and the first photoresist pattern includes a polymer including silicon.

In some exemplary embodiments of the present inventive concept, the polymer including silicon may include a unit represented by the following chemical formula 5.

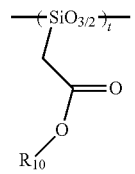

[chemical formula 5]

Where "$R_{10}$" represents hydrogen, C1-C10 alkyl group, C1-C10 alkenyl group, C1-C10 alkynyl group, C6-C10 aryl group, adamantyl group, C1-C5 alkyl-adamantyl group, or C2-C6 lactone group, and "t" is an integral number of 1 to 10. The polymer including silicon may have a weight average molecular weight of 1,000 to 100,000.

In some exemplary embodiments of the present inventive concept, a content of silicon may range from 10 wt % to 40 wt % in the first photoresist pattern.

In some exemplary embodiments of the present inventive concept, the first lower layer may include a cross-linker including a compound represented by the following chemical formula 1.

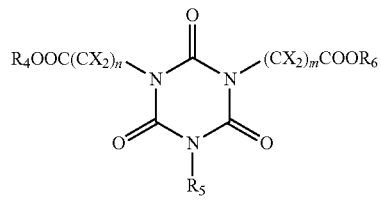

[chemical formula 1]

In the chemical formula 1, at least two of $R_4OOC(CX_2)_n$—, $R_5$—, and $R_6OOC(CX_2)_m$— are different acids or different ester groups, each of "$R_4$," "$R_5$," "$R_6$," and "X" independently represent a hydrogen or a non-hydrogen substituent, and each of "n" and "m" is an integral number greater than 0. The non-hydrogen substituent may be a substituted or unsubstituted C1-C10 alkyl group, a substituted or unsubstituted C2-C10 alkenyl or C2-C10 alkynyl group, a substituted or unsubstituted C1-C10 alkanoyl group, a substituted or unsubstituted C1-C10 alkoxy group, an epoxy group, a substituted or unsubstituted C1-C10 alkylthio group, a substituted or unsubstituted C1-C10 alkylsulphinyl group, a substituted or unsubstituted C1-C10 alkylsulfonyl group, a substituted or unsubstituted carboxyl group, a substituted or unsubstituted —COO—(C1-C8 alkyl), a substituted or unsubstituted C6-C12 aryl group, or a substituted or unsubstituted 5- to 10-membered heteroalicyclic or heteroaryl group.

In some exemplary embodiments of the present inventive concept, the forming of the stepwise structure may include repeating a process cycle. The process cycle may include etching at least one of the insulating layers exposed by the first lower pattern using the first lower pattern as an etch mask, etching at least one of the sacrificial layers under the at least one of the insulating layers, and trimming the first lower pattern to reduce a width and a height of the first lower pattern.

In some exemplary embodiments of the present inventive concept, the trimming of the first lower pattern may include reducing the width by a first length, and reducing the height by a second length. The second length may be greater than the first length and smaller than 1.5 times the first length.

In some exemplary embodiments of the present inventive concept, the process cycle may be repeated until a lowermost insulating layer and a lowermost sacrificial layer of the stack structure are etched.

In some exemplary embodiments of the present inventive concept, the substrate may include a cell array region, a second contact region adjacent to the cell array region, and a first contact region spaced apart from the cell array region with the second contact region disposed between the cell array region and the first contact region. The etched first part of the stack structure may be disposed in the second contact region. The method for manufacturing the semiconductor device may include forming a second lower pattern including a novolac-based organic polymer on the stack structure, and etching the stack structure in the first contact region using the second lower pattern as an etch mask to form the stepwise structure in the first contact region.

In some exemplary embodiments of the present inventive concept, the substrate may include a cell array region, a second contact region adjacent to the cell array region, and a first contact region spaced apart from the cell array region with the second contact region disposed between the cell array region and the first contact region. The etched first part of the stack structure may be disposed in the second contact region. The method for manufacturing the semiconductor device may include forming a second photoresist pattern on the stack structure, and etching the stack structure in the first contact region using the second photoresist pattern as an etch mask to form the stepwise structure in the first contact region. The second photoresist pattern may include a copolymer including a plurality of units represented by the following chemical formulas 2 and 3 and optionally a plurality of units represented by the following chemical formula 4.

[chemical formula 2]

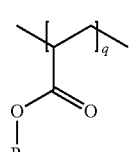

[chemical formula 3]

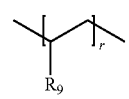

[chemical formula 4]

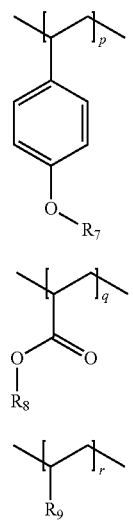

In the chemical formulas 2 to 4, each of "$R_7$," "$R_8$," and "$R_9$" independently represents hydrogen, C1-C20 hydrocarbyl group, or C1-C20 hydrocarbyl group substituted with a group represented by —O—$R_{11}$, "$R_{11}$" is C1-C10 alkyl, C2-C10 alkenyl, C2-C10 alkynyl, C6-C10 aryl or C3-C10 cycloalkyl, "p" is an integral number of from 1 to 10, "q" is an integral number of from 1 to 10, and "r" is an integral number of from 1 to 10. The copolymer may have a weight average molecular weight of 1,000 to 100,000.

In some exemplary embodiments of the present inventive concept, the method may include forming channel holes that penetrate the stack structure to expose the substrate, and forming a gate insulating layer and a channel layer that are sequentially stacked on an inner sidewall of each of the channel holes.

In some exemplary embodiments of the present inventive concept, the method may include selectively removing the sacrificial layers to form recess regions between the insulating layers, and forming gate electrodes filling the recess regions, respectively.

In some exemplary embodiments of the present inventive concept, end portions of the gate electrodes may correspond to the stepwise structure of end portions of the sacrificial layers. The method for manufacturing the semiconductor device may include forming a contact plug that penetrates an end portion of at least one of the insulating layers. The contact plug may be electrically connected to the end portion of at least one of the gate electrodes.

According to an exemplary embodiment of the present inventive concept, a method for manufacturing a semiconductor device includes foil ing a stack structure including insulating layers and sacrificial layers which are alternately and repeatedly stacked on a substrate, forming an organic polymer layer on the stack structure, and forming a photoresist layer containing silicon on the organic polymer layer. The method includes exposing and developing the photoresist layer to form a photoresist pattern, etching the organic polymer layer using the photoresist pattern as an etch mask to form an organic polymer pattern, and etching the stack structure using the organic polymer pattern as an etch mask to form a stepwise structure. A thickness of the organic polymer layer range from 10 times to 30 times a thickness of the photoresist layer.

In some exemplary embodiments of the present inventive concept, the photoresist layer may include a polymer having a unit represented by the following chemical formula 5.

[chemical formula 5]

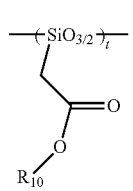

Where "$R_{10}$" represents hydrogen, C1-C10 alkyl group, C1-C10 alkenyl group, C1-C10 alkynyl group, C6-C10 aryl group, adamantyl group, C1-C5 alkyl-adamantyl group, or C2-C6 lactone group, and "t" is an integral number of 1 to 10. The polymer may have a weight average molecular weight of 1,000 to 100,000.

In some exemplary embodiments of the present inventive concept, the organic polymer layer may include a novolac-based polymer.

According to an exemplary embodiment of the present inventive concept, a method for manufacturing a semiconductor device comprises: forming an organic polymer layer on an etch target layer disposed on a substrate; forming a photoresist layer comprising silicon on the organic polymer layer, wherein the photoresist layer comprises a polymer having a unit represented by the following chemical formula 5.

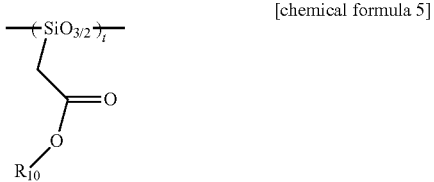

[chemical formula 5]

Where "$R_{10}$" represents hydrogen, C1-C10 alkyl group, C1-C10 alkenyl group, C1-C10 alkynyl group, C6-C10 aryl group, adamantyl group, C1-C5 alkyl-adamantyl group, or C2-C6 lactone group, and "t" is an integral number of 1 to 10. The polymer has a weight average molecular weight of 1,000 to 100,000; and etching the organic polymer layer using the photoresist layer as an etch mask to form an organic polymer pattern; and etching the etch target layer using the organic polymer pattern as an etch mask to form a stepwise structure.

In some exemplary embodiments of the present inventive concept, a thickness of the organic polymer layer ranges from 10 times to 30 times a thickness of the photoresist layer.

In some exemplary embodiments of the present inventive concept, the organic polymer layer includes a novolac-based polymer.

In some exemplary embodiments of the present inventive concept, to organic polymer layer includes a cross-linker comprising a compound represented by the following chemical formula 1,

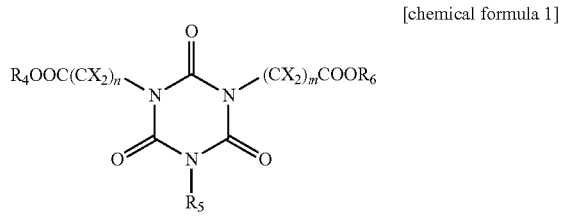

[chemical formula 1]

wherein at least two of $R_4OOC(CX_2)_n-$, $R_5-$, and $R_6OOC(CX_2)_m-$ are different acids or different ester groups, each of "$R_4$," "$R_5$," "$R_6$," and "X" independently represents a hydrogen or a non-hydrogen substituent, and each of "n" and "m" is an integral number greater than 0.

BRIEF DESCRIPTION OF THE DRAWINGS

The above and other features of the present inventive concept will become more apparent by describing in detail exemplary embodiments thereof, with reference to the accompanying drawings in which.

DETAILED DESCRIPTION OF THE EMBODIMENTS

Figure 1:
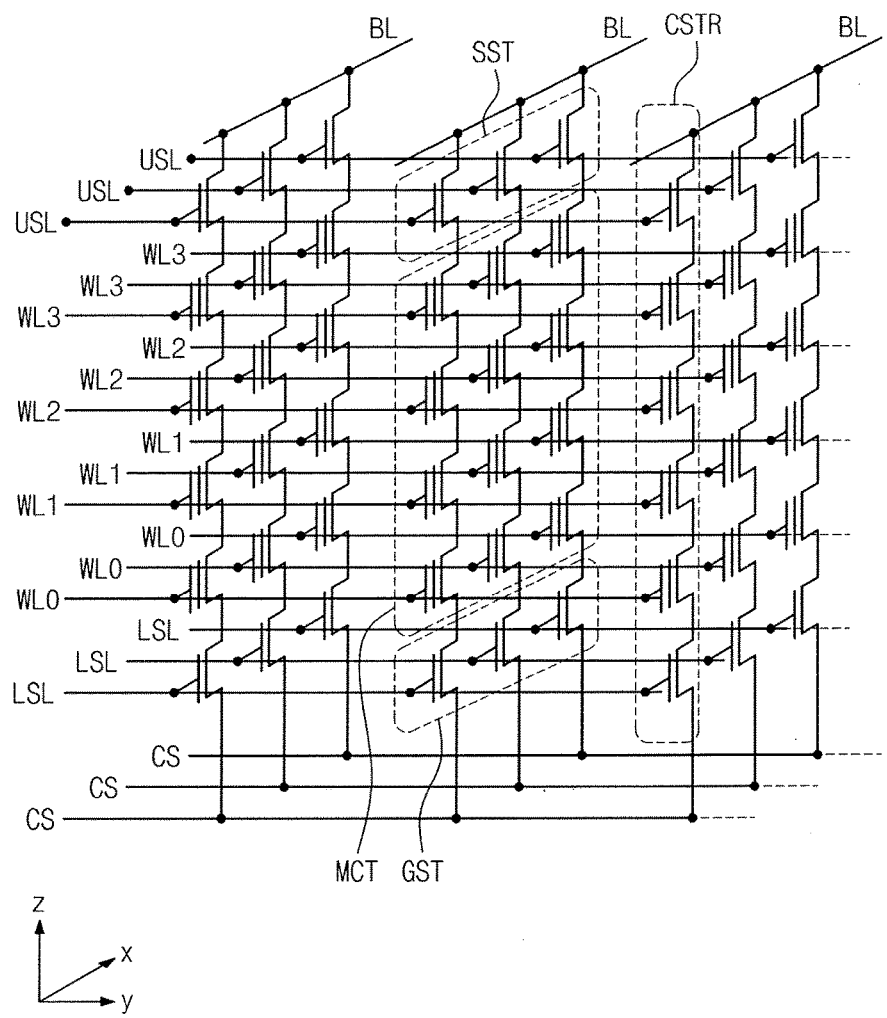
FIG. 1 is a schematic circuit diagram illustrating a cell array of a three-dimensional (3D) semiconductor memory device according to some exemplary embodiments of the present inventive concept.

Exemplary embodiments of the present inventive concept will now be described in more detail with reference to the accompanying drawings in which exemplary embodiments are shown. Exemplary embodiments of the present inventive concept may, however, may be embodied in various different forms, and should not be construed as being limited to the exemplary embodiments described herein. In the drawings, exemplary embodiments of the present inventive concept are not limited to the specific examples provided herein and components, layers or regions illustrated in the drawings may be exaggerated for clarity of description.

In the specification and drawings, it will be understood that when an element such as a layer, region or substrate is referred to as being "on" another element, it may be directly on the other element or intervening elements may be present. The same reference numerals or the same reference designators may denote the same elements throughout the specification and drawings.

Exemplary embodiments of the present inventive concept may be described herein with reference to cross-sectional views and/or plan views that are exemplary views. In the drawings, the thicknesses of layers and regions may be exaggerated for clarity. Accordingly, variations from the shapes of the illustrations as a result, for example, of manufacturing techniques and/or tolerances may occur. Thus, exemplary embodiments of the present inventive concept should not be construed as limited to the shapes of regions illustrated herein but are to include deviations in shapes that result, for example, from manufacturing. It will be understood that although the terms first, second, and third may be used herein to describe various elements, these elements should not be limited by these terms. Exemplary embodiments of the present inventive concept explained and illustrated herein may include their complementary counterparts.

FIG. 1 is a schematic circuit diagram illustrating a cell array of a three-dimensional (3D) semiconductor memory device according to some exemplary embodiments of the present inventive concept.

Referring to FIG. 1, a cell array of a 3D semiconductor memory device according to some exemplary embodiments of the present inventive concept may include a common source line CS, a plurality of bit lines BL, and a plurality of cell strings CSTR connected between the common source line CS and the bit lines BL.

The common source line CS may be a conductive layer disposed on a substrate or a dopant region formed in the substrate. In some exemplary embodiments of the present inventive concept, the common source line CS may include a conductive pattern (e.g., a metal line) vertically spaced apart from the substrate. The bit lines BL may include conductive patterns (e.g., metal lines vertically spaced apart from the substrate). In some exemplary embodiments of the present inventive concept, the bit lines BL may intersect the common source line CS and may be vertically spaced apart from the common source line CS. The bit lines BL may be two-dimensionally arranged. A plurality of the cell strings CSTR may be connected in parallel to each of the bit lines BL. The cell strings CSTR may be connected in common to the common source line CS. A plurality of the cell strings CSTR may be disposed between the common source line CS and the plurality of bit lines BL. In some exemplary embodiments of the present inventive concept, the common source line CS may include a plurality of common source lines CS two-dimensionally arranged. In some exemplary embodiments of the present inventive concept, the same voltage may be applied to the plurality of the common source lines CS. In some exemplary embodiments of the present inventive concept, the common source lines CS may be electrically controlled independently of each other.

Each of the cell strings CSTR may include a ground selection transistor GST connected to the common source line CS, a string selection transistor SST connected to the bit line BL, and a plurality of memory cell transistors MCT disposed between the ground and string selection transistors GST and SST. The ground selection transistor GST, the memory cell transistors MCT, and the string selection transistor SST may be connected in series to each other.

The common source line CS may be connected in common to sources of the ground selection transistors GST. A lower selection line LSL, a plurality of word lines WL0 to WL3 and an upper selection line USL which may be disposed between the common source line CS and the bit lines BL may be used as a gate electrode of the ground selection transistor GST, gate electrodes of the memory cell transistors MCT and a gate electrode of the string selection transistor SST, respectively. Each of the memory cell transistors MCT may include a data storage element.

Figure 2:
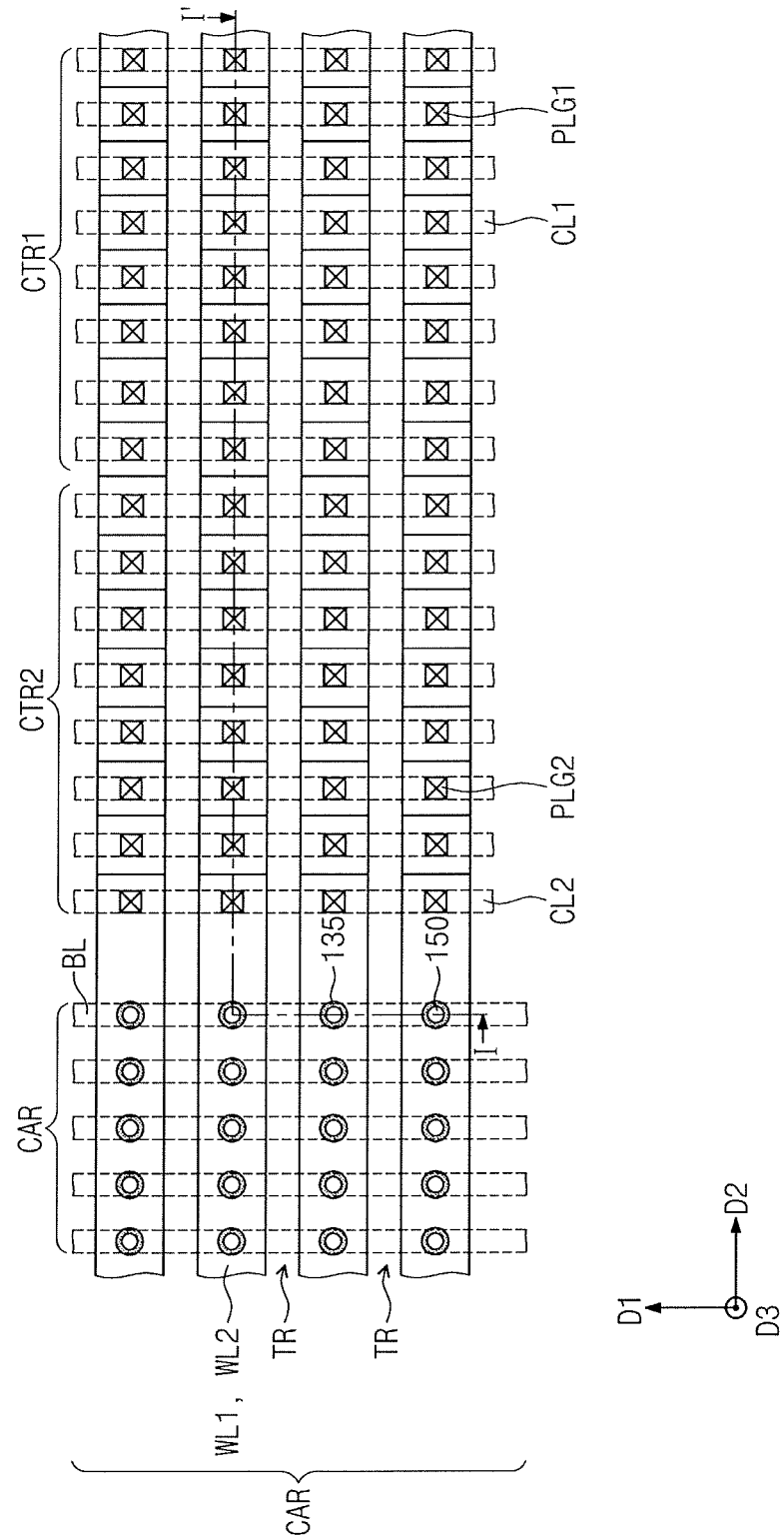
FIG. 2 is a plan view illustrating a 3D semiconductor memory device according to some exemplary embodiments of the present inventive concept.
Figure 3:
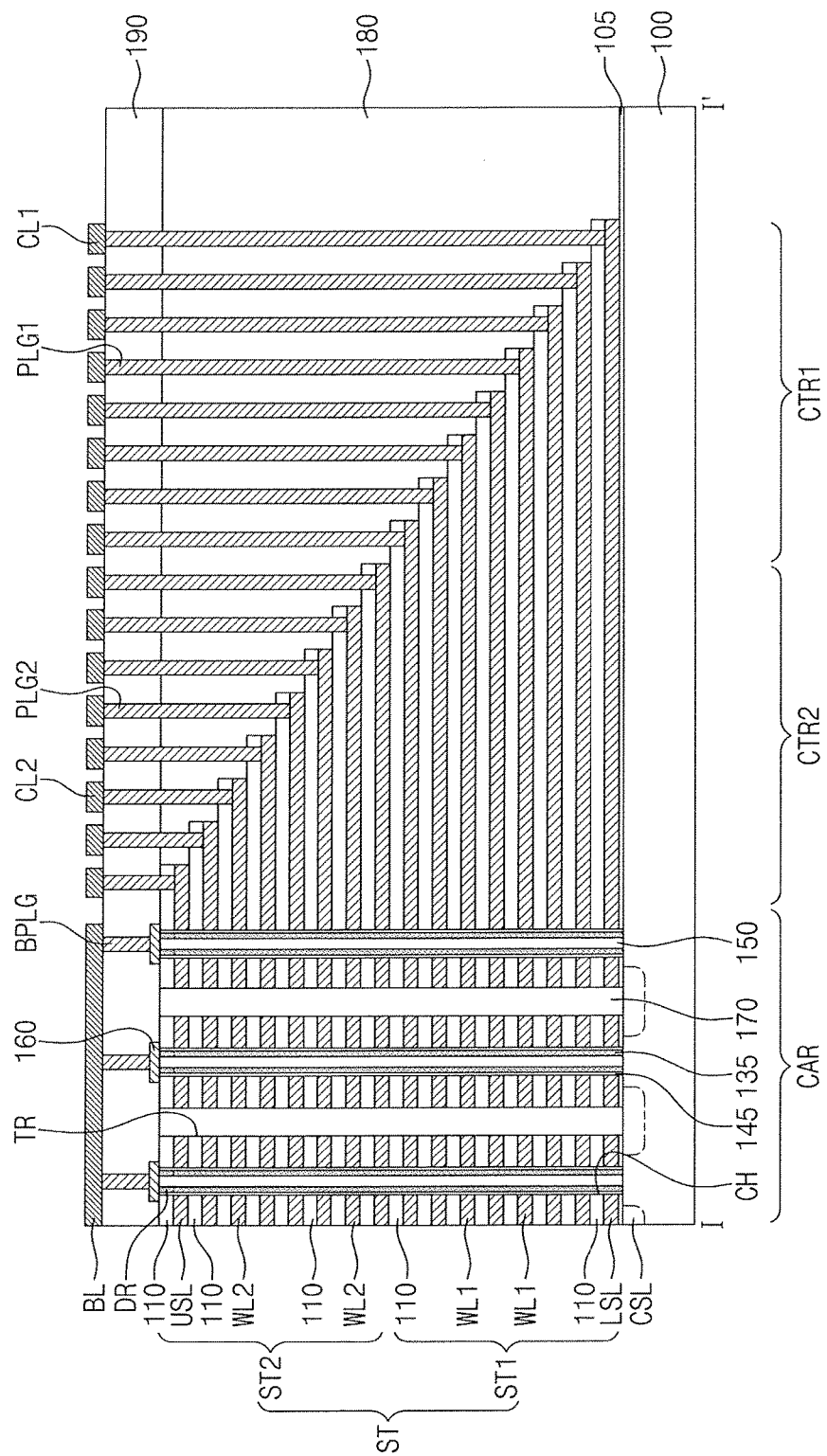
FIG. 3 is a cross-sectional view taken along a line I-I' of FIG. 2 illustrating a 3D semiconductor memory device according to some exemplary embodiments of the present inventive concept.

FIG. 2 is a plan view illustrating a 3D semiconductor memory device according to some exemplary embodiments of the present inventive concept. FIG. 3 is a cross-sectional view taken along a line I-I' of FIG. 2 illustrating a 3D semiconductor memory device according to some exemplary embodiments of the present inventive concept.

Referring to FIGS. 2 and 3, a 3D semiconductor memory device may include a substrate 100. The substrate 100 may be, for example, a silicon substrate, a germanium substrate, or a silicon-germanium substrate. The substrate 100 may include common source regions CSL doped with dopants. In some exemplary embodiments of the present inventive concept, the common source regions CSL may each have a linear shapes extending in a second direction D2 parallel to a top surface of the substrate 100. The common source regions CSL may be arranged along a first direction D1 intersecting the second direction D2.

Stack structures ST may be disposed on the substrate 100. Each of the stack structures ST may include insulating layers 110 and gate electrodes LSL, WL1, WL2, and USL which may be alternately and repeatedly stacked on the substrate 100. A lower portion of each of the stack structures ST may be referred to as a first stack structure ST1, and an upper portion of each of the stack structures ST may be referred to as a second stack structure ST2. The second stack structure ST2 may be disposed on the first stack structure ST1. The stack structures ST may each have a linear shape extending in the second direction D2 and may be arranged along the first direction D1 when viewed from a plan view.

Each of the common source regions CSL may be disposed in the substrate 100 between the stack structures ST adjacent teach other. A lower insulating layer 105 may be disposed between the substrate 100 and the first stack structures ST1. In some exemplary embodiments of the present inventive concept, the lower insulating layer 105 may include a silicon oxide layer and/or a high-k dielectric layer (e.g., a silicon nitride layer, an aluminum oxide layer, or a hafnium oxide layer). The lower insulating layer 105 may be thinner than the insulating layers 110.

The gate electrodes LSL, WL1, WL2, and USL may be stacked along a third direction D3 perpendicular to the first and second directions D1 and D2. The gate electrodes LSL, WL1, WL2, and USL may be vertically spaced apart from each other. The gate electrodes LSL, WL1, WL2, and USL may be separated from each other by the insulating layers 110 disposed between the gate electrodes LSL, WL1, WL2, and USL. In some exemplary embodiments of the present inventive concept, the gate electrodes LSL and WL1 of each of the first stack structures ST1 may include a lower selection line LSL and first word lines WL1. The gate electrodes WL2 and USL of each of the second stack structures ST2 may include second word lines WL2 and an upper selection line USL. For example, the gate electrodes LSL, WL1, WL2, and USL may include doped silicon, a metal (e.g., tungsten), a metal nitride, a metal silicide, or any combination thereof. For example, each of the insulating layers 110 may include a silicon oxide layer.

The lower selection line LSL may be the lowermost one of the gate electrodes LSL and WL1 in each of the first stack structures ST1. The lower selection line LSL may be used as the gate electrode of the ground selection transistor GST. The upper selection line USL may be the uppermost one of the gate electrodes WL2 and USL in each of the second stack structures ST2. The upper selection line USL may be used as the gate electrode of the string selection transistor SST. The first and second word lines WL1 and WL2 may be used as the gate electrodes of the memory cell transistors MCT.

The substrate 100 may include a cell array region CAR, a first contact region CTR1, and a second contact region CTR2. At least one end portion of the stack structure ST may be disposed on the substrate 100 of the first and second contact regions CTR1 and CTR2. One end portion of the first stack structure ST1 may be disposed on the substrate 100 of the first contact region CTR1, and one end portion of the second stack structure ST2 may be disposed on the substrate 100 of the second contact region CTR2. In some exemplary embodiments of the present inventive concept, the second contact region CTR2 may be adjacent to the cell array region CAR. The first contact region CTR1 may be spaced apart from the cell array region CAR with the second contact region CTR2 disposed between the first contact region CTR1 and the cell array region CAR when viewed from a plan view. The first stack structure ST1 may extend from the cell array region CAR into the first contact region CTR1 through the second contact region CTR2, and the second stack structure ST2 may extend from the cell array region CAR into the second contact region CTR2.

To electrically connect the gate electrodes LSL, WL1, WL2, and USL to a peripheral logic structure, each of the stack structures ST may have a stepwise structure on the substrate 100 of the first and second contact regions CTR1 and CT2. A vertical height of the stepwise structure of the first and second contact regions CTR1 and CTR2 may increase as a distance from the cell array region CAR decreases. The stack structure ST may have a sloped profile on the substrate 100 of the first and second contact regions CTR1 and CTR2.

Planar areas of the gate electrodes LSL and WL1 on the substrate 100 of the first contact region CTR1 may be sequentially reduced as a distance from the top surface of the substrate 100 in the third direction D3 increases. Thus, the lower selection line LSL corresponding to the lowermost one of the gate electrodes LSL and WL1 may have the greatest planar area. Planar areas of the gate electrodes WL2 and USL on the substrate 100 of the second contact region CTR2 may be sequentially reduced as a distance from the top surface of the substrate 100 in the third direction D3 increases. Thus, the upper selection line USL corresponding to the uppermost one of the gate electrodes WL2 and USL may have the smallest planar area.

A first interlayer insulating layer 180 may be disposed on the substrate 100 and may cover at least a portion of each of the stack structures ST. The first interlayer insulating layer 180 may have a planarized top surface and may cover the stepwise structures of the stack structures ST on the substrate 100 of the first and second contact regions CTR1 and CTR2. A second interlayer insulating layer 190 may be disposed on the first interlayer insulating layer 180 and the stack structures ST.

A plurality of channel holes CH may penetrate the stack structures ST disposed on the substrate 100 of the cell array region CAR. A channel layer 135 may extend along an inner sidewall of each of the channel holes CH toward the substrate 100. The channel layers 135 may be electrically connected to the substrate 100. In some exemplary embodiments of the present inventive concept, the channel layers 135 may be in direct contact with the top surface of the substrate 100. The channel layers 135 penetrating each of the stack structures ST may be arranged along the second direction D2 when viewed from a plan view. In some exemplary embodiments of the present inventive concept, the channel layers 135 of each of the stack structures ST may be arranged in a line along the second direction D2. In some exemplary embodiments of the present inventive concept, the channel layers 135 of each of the stack structures ST may be arranged in a zigzag form along the second direction D2.

In some exemplary embodiments of the present inventive concept, the channel layer 135 may have a pipe or macaroni shape having an opened bottom end and an open top end. In some exemplary embodiments of the present inventive concept, the channel layer 135 may have a pipe or macaroni shape having a closed bottom end.

The channel layers 135 may be undoped or may be doped with dopants having the same conductivity type as the substrate 100. The channel layers 135 may include a semiconductor material having a poly-crystalline structure or a single-crystalline structure. For example, the channel layers 135 may include silicon. An inner space surrounded by the channel layer 135 may be filled with a filling insulation pattern 150. For example, the filling insulation pattern 150 may include silicon oxide.

A gate insulating layer 145 may be disposed between the stack structure ST and each of the channel layers 135. The gate insulating layer 145 may cover the inner sidewall of the channel hole CH directly. The gate insulating layer 145 may extend in the third direction D3. The gate insulating layer 145 may have a pipe or macaroni shape of which top and bottom ends are open.

The gate insulating layer 145 may include a single layer or a plurality of layers. In some exemplary embodiments of the present inventive concept, the gate insulating layer 145 may include a tunnel insulating layer and a charge storage layer of a charge-trap type flash memory transistor. The tunnel insulating layer may include a material of which an energy band gap is greater than that of the charge storage layer. For example, the tunnel insulating layer may include at least one of a silicon oxide layer or a high-k dielectric layer (e.g., an aluminum oxide layer or a hafnium oxide layer). The charge storage layer may include at least one of a trap site-rich insulating layer (e.g., a silicon nitride layer), a floating gate electrode, or an insulating layer including conductive nano dots. The tunnel insulating layer may be in direct contact with the channel layer 135. A blocking insulating layer may be disposed between the charge storage layer and each of the gate electrodes LSL, WL1, WL2, and USL. The blocking insulating layer may extend between the insulating layer 110 and each of the gate electrodes LSL, WL1, WL2, and USL. The blocking insulating layer may include a material of which an energy band gap is smaller than that of the tunnel insulating layer and greater than that of the charge storage layer. For example, the blocking insulating layer may include a high-k dielectric layer (e.g., an aluminum oxide layer or a hafnium oxide layer).

Income exemplary embodiments of the present inventive concept, the gate insulating layer 145 may include the tunnel insulating layer, the charge storage layer, and the blocking insulating layer. The tunnel insulating layer may be in direct contact with the channel layer 135, and the blocking insulating layer may be in direct contact with the gate electrodes LSL, WL1, WL2, and USL. The charge storage layer may be disposed between the tunnel insulating layer and the blocking insulating layer. In this case, the gate electrodes LSL, WL1, WL2, and USL may be in direct contact with the insulating layers 110.

A filling insulation layer 170 may fill trenches TR between the stack structures ST. The filling insulation layer 170 may include a silicon oxide layer.

A top end portion of each of the channel layers 135 may include a drain region DR. A conductive pad 160 may be in contact with the drain region DR of each of the channel layers 135. The second interlayer insulating layer 190 may cover the conductive pads 160. A plurality of bitline plugs BPLG may penetrate the second interlayer insulating layer 190 and may be electrically connected to the conductive pads 160, respectively. Bit lines BL may be disposed on the bit line plugs BPLG. The bit lines BL may each have a linear shape extending in the first direction D1. Each of the bit lines BL may be electrically connected to the conductive pads 160 arranged in the first direction D1 through the bit line plugs BPLG.

An interconnection structure electrically connecting the gate electrodes LSL, WL1, WL2, and USL to the peripheral logic structure may be disposed on the stack structures ST disposed on the substrate 100 of the first and second contact regions CTR1 and CTR2.

First contact plugs PLG1 may penetrate the second and first interlayer insulating layers 190 and 180 and may be connected to end portions of the gate electrodes LSL and WL1 disposed on the substrate 100 of the first contact region CTR1, respectively. Second contact plugs PLG2 may penetrate the second and first interlayer insulating layers 190 and 180 and may be connected to end portions of the gate electrodes WL2 and USL disposed on the substrate 100 of the second contact region CTR2, respectively. Vertical lengths of the first and second contact plugs PLG1 and PLG2 may be sequentially reduced as a distance from the cell array region CAR decreases. Top surfaces of the first and second contact plugs PLG1 and PLG2 may be substantially coplanar with each other.

First connection lines CL1 may be disposed on the second interlayer insulating layer 190 of the first contact region CTR1 and may be electrically connected to the first contact plugs PLG1. Second connection lines CL2 may be disposed on the second interlayer insulating layer 190 of the second contact region CTR2 and may be electrically connected to the second contact plugs PLG2.

FIGS. 4 to 23 are cross-sectional views taken along the line I-I' of FIG. 2 illustrating a method for manufacturing a 3D semiconductor memory device according to some embodiments of the inventive concept.

Figure 4:
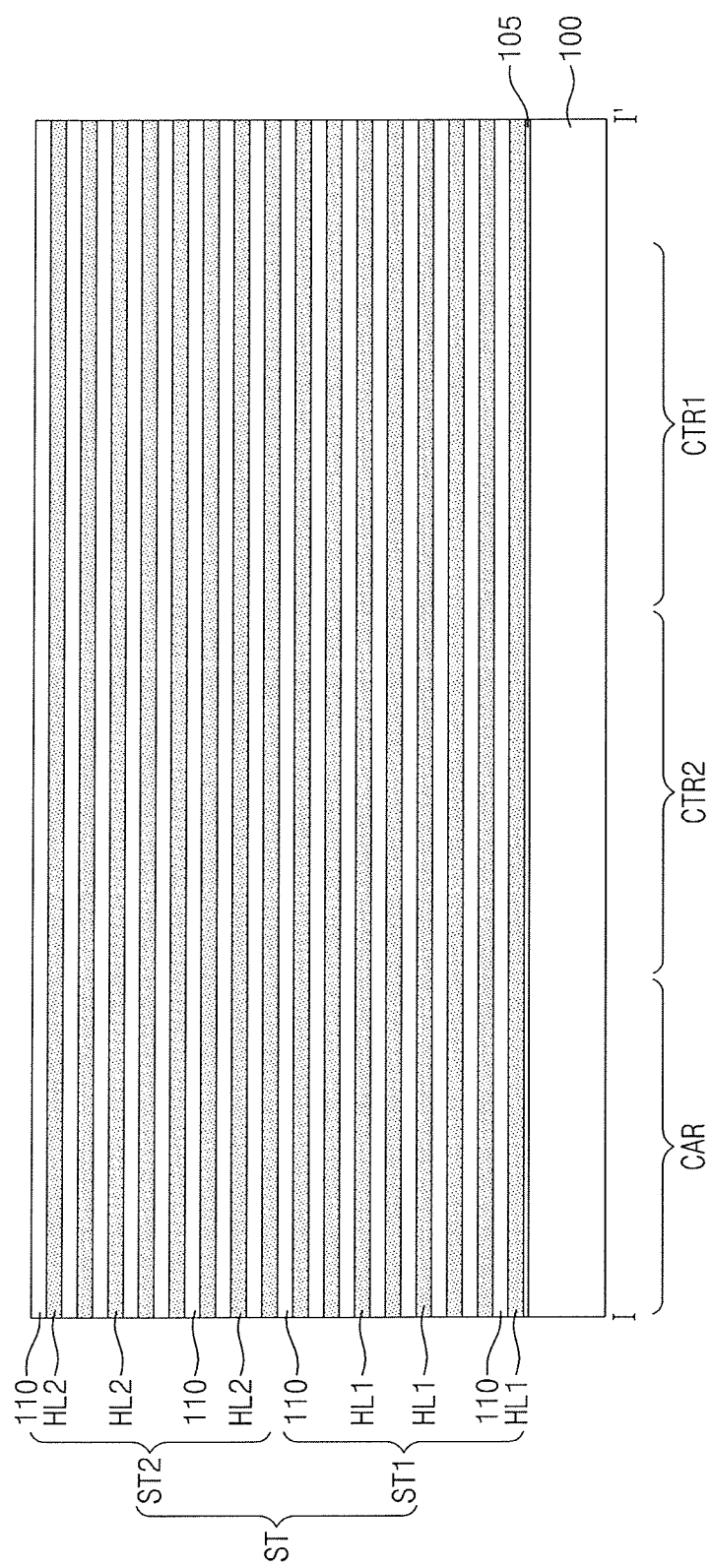
FIGS. 4 to 23 are cross-sectional views taken along the line I-I' of FIG. 2 illustrating a method for manufacturing a 3D semiconductor memory device according to some exemplary embodiments of the present inventive concept.

Referring to FIGS. 2 and 4, sacrificial layers HL1 and HL2 and insulating layers 110 may be alternately and repeatedly deposited on a substrate 100 to form a stack structure ST. The stack structure ST may include a first stack structure ST1 disposed on the substrate 100 and a second stack structure ST2 disposed on the first stack structure ST1. The first stack structure ST1 may include first sacrificial layers HL1, and the second stack structure ST2 may include second sacrificial layers HL2.

In some exemplary embodiments of the present inventive concept, the sacrificial layers HL1 and HL2 may have substantially the same thickness. In some exemplary embodiments of the present inventive concept, the lowermost one and the uppermost one of the sacrificial layers HL1 and HL2 may be thicker than other sacrificial layers disposed between the lowermost and uppermost sacrificial layers HL1 and HL2. The insulating layers 110 may have substantially the same thickness, or a thickness of one or more of the insulating layers 110 may be different from that of other insulating layers of the insulating layers 110.

The sacrificial layers HL1 and HL2 and the insulating layers 110 may be deposited using a thermal chemical vapor deposition (thermal CVD) method, a plasma-enhanced CVD method, a physical CVD method, and/or an atomic layer deposition (ALD) method. For example, each of the sacrificial layers HL1 and HL2 may include a silicon nitride layer, a silicon oxynitride layer, or a silicon layer. In some exemplary embodiments of the present inventive concept, the sacrificial layers HL1 and HL2 may include a polycrystalline structure or a single-crystalline structure. For example, each of the insulating layers 110 may include a silicon oxide layer.

A lower insulating layer 105 may be formed between the substrate 100 and the first stack structure ST1. The lower insulating layer 105 may include a material having an etch selectivity with respect to the sacrificial layers HL1 and HL2. In some exemplary embodiments of the present inventive concept, the lower insulating layer 105 may include a silicon oxide layer and/or a high-k dielectric layer (e.g., a silicon nitride layer, an aluminum oxide layer, or a hafnium oxide layer). The lower insulating layer 105 may be thinner than the sacrificial layers HL1 and HL2 and the insulating layers 110.

Figure 5:
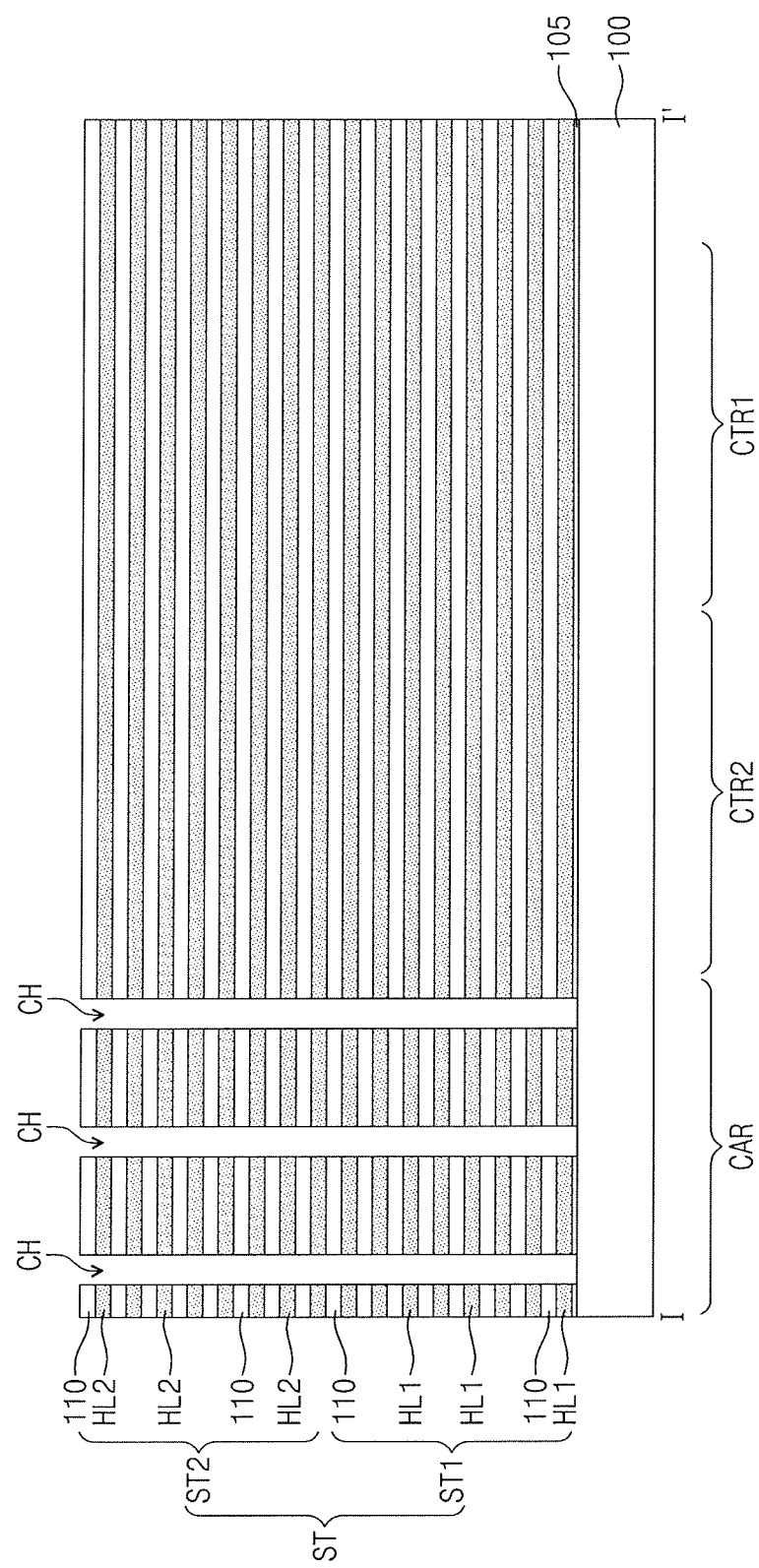

Referring to FIGS. 2 and 5, channel holes CH may be formed to penetrate the stack structure ST. The channel holes CH may expose the substrate 100. The channel holes CH may be arranged in the same manner as the channel layers 135 when viewed from a plan view.

The formation of the channel holes CH may include forming a mask pattern having openings on the stack structure ST, and etching the stack structure ST using the mask pattern as an etch mask. The openings of the mask pattern may define regions in which the channel holes CH are to be formed. The mask pattern may be removed after forming the channel holes CH. The top surface of the substrate 100 under the channel holes CH may be recessed by over-etching the stack structure ST.

Figure 6:
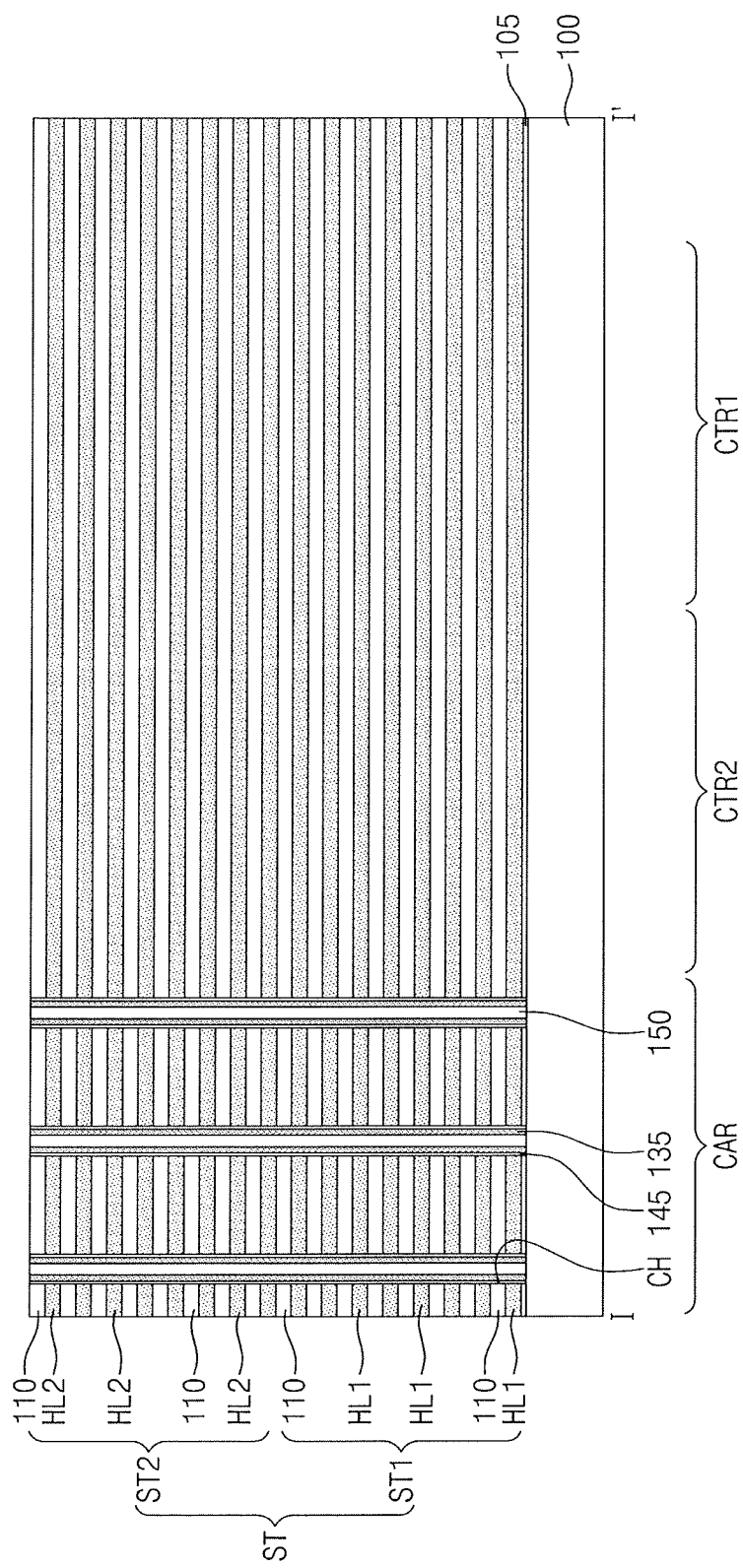

Referring to FIGS. 2 and 6, a gate insulating layer 145 and a channel layer 135 may be formed to sequentially cover an inner sidewall of each of the channel holes CH. In some exemplary embodiments of the present inventive concept, the gate insulating layer 145 may include a tunnel insulating layer and a charge storage layer. In some exemplary embodiments of the present inventive concept, the gate insulating layer 145 may further include a blocking insulating layer. The blocking insulating layer may be formed between the charge storage layer and the sacrificial layers HL1 and HL2. Each of the gate insulating layer 145 and the channel layer 135 may be formed using an ALD method or a CVD method. A filling insulation pattern 150 may be formed to completely fill each of the channel holes CH.

Figure 7:
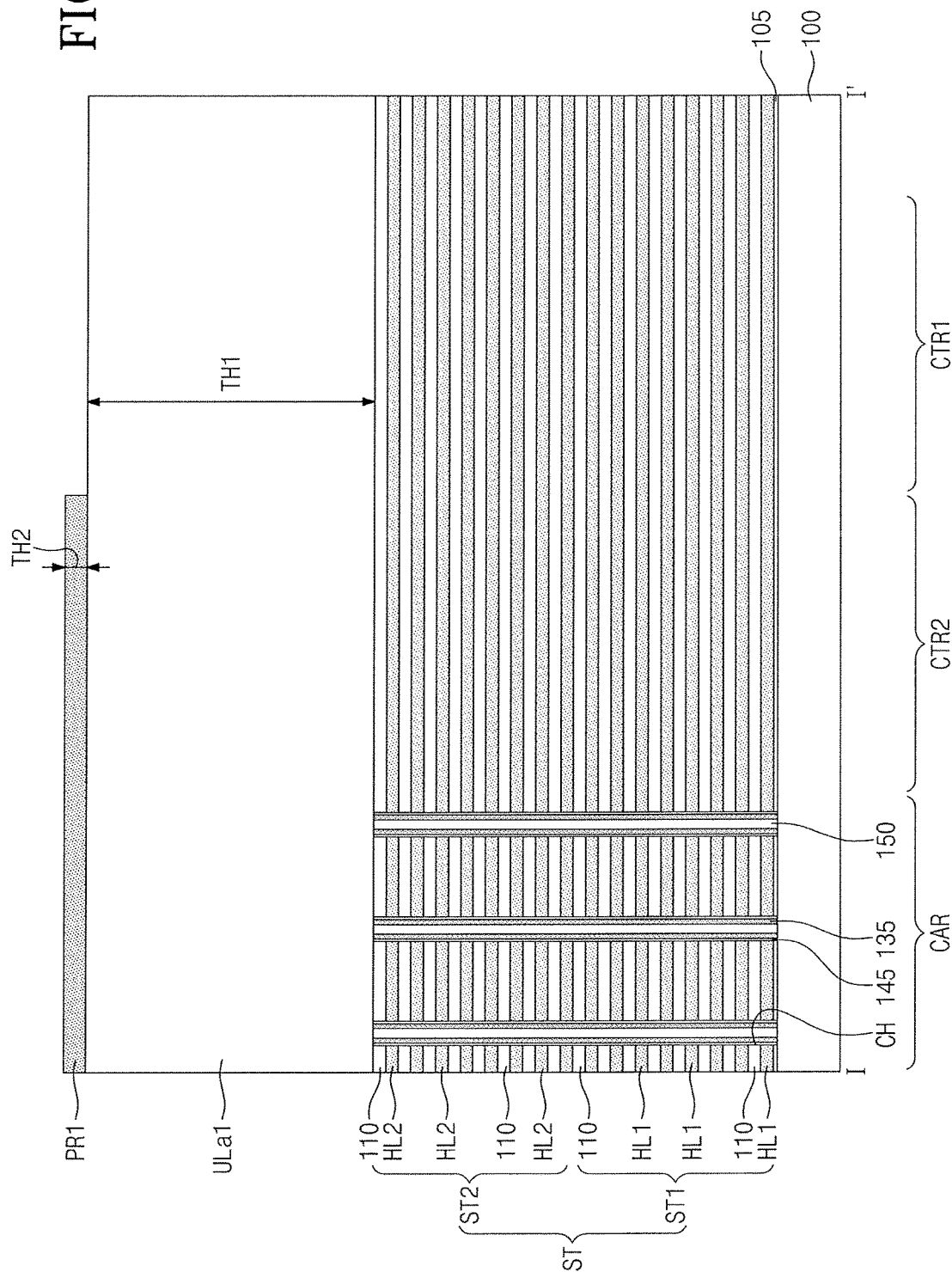

Referring to FIGS. 2 and 7, a first lower layer ULa1 and a first photoresist pattern PR1 may be sequentially formed on the second stack structure ST2. The first lower layer ULa1 may cover substantially an entire top surface of the second stack structure ST2. The first photoresist pattern PR1 may be formed on the first lower layer ULa1 of the cell array region CAR and the second contact region CTR2 adjacent to the cell array region CAR. The first photoresist pattern PR1 need not overlap with the stack structure ST disposed on the substrate 100 of the first contact region CTR1 spaced apart from the cell array region CAR with the second contact region CTR2 disposed between the cell array region CAR and the first contact region CTR1.

Forming the first lower layer ULa1 may include depositing an organic composition on the top surface of the second stack structure ST2. The first lower layer ULa1 may have a first thickness TH1. The organic composition may include a novolac-based organic polymer. The organic composition may include a cross-linker including a compound represented by the following chemical formula 1.

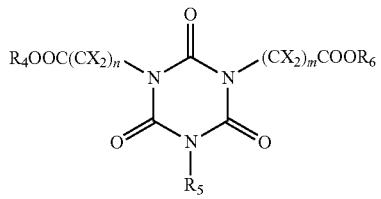

[Chemical formula 1]

In the chemical formula 1, at least two of $R_4OOC(CX_2)_n-$, $R_5-$, and $R_6OOC(CX_2)_m-$ are different acids or different ester groups, and each of "$R_4$", "$R_5$", "$R_6$", and "X" independently represents a hydrogen or a non-hydrogen substituent. The non-hydrogen substituent may be a substituted or unsubstituted C1-C10 alkyl group, a substituted or unsubstituted C2-C10 alkenyl (e.g., allyl) or C2-C10 alkynyl group, a substituted or unsubstituted C1-C10 alkanoyl group, a substituted or unsubstituted C1-C10 alkoxy (e.g., methoxy, propoxy, or butoxy) group, an epoxy group, a substituted or unsubstituted C1-C10 alkylthio group, a substituted or unsubstituted C1-C10 alkylsulphinyl group, a substituted or unsubstituted C1-C10 alkylsulfonyl group, a substituted or unsubstituted carboxyl group, a substituted or unsubstituted —COO—C1-8 alkyl group, a substituted or unsubstituted C6-C12 aryl (e.g., phenyl or naphthyl) group, or a substituted or unsubstituted 5- to 10-membered heteroalicyclic or heteroaryl group (e.g., methylphthalimide or N-methyl-1,8-naphthalimide). In the chemical formula 1, "n" and "m" may be equal to or different from each other, and each of "n" and "m" may be an integral number greater than 0.

The organic composition may include a solvent and an acid (or an acid generator).

For example, the solvent may include at least one of hydroxybutyric acid esters, glycol ethers, ethers having a hydroxyl group, esters, dibasic esters, propylene carbonates, or γ-butyrolactones.

For example, the acid may include at least one of p-toluene sulfonic acid, dodecyl benzene sulfonic acid, oxalic acid, phthalic acid, phosphoric acid, camphorsulfonic acid, 2,4,6-trimethylbenzene sulfonic acid, triisonaphthalene sulfonic acid, 5-nitro-o-toluene sulfonic acid, 5-sulfosalicyl acid, 2,5-dimethylbenzyl sulfonic acid, 2-nitrobenzene sulfonic acid, 3-chlorobenzene sulfonic acid, 3-bromobenzene sulfonic acid, 2-fluorocapryl sulfonic acid, 1-naphthol-5-sulfonic acid, or 2-methoxy-4-hydroxy-5-benzoylbenzene sulfonic acid.

The acid generator may be a photo acid generator or a thermal acid generator. For example, the photo acid generator may include at least one of onium salts, nitrobenzyls, sulfonic acid esters, diazomethanes, glyoximes, N-hydroxy-imide sulfonic acid esters, or halotriazines. The thermal acid generator may accelerate or increase a crosslinking reaction while the first lower layer ULa1 is hardened. For example, the thermal acid generator may include at least one of cyclohexyl p-toluene sulfonate, methyl p-toluene sulfonate, cyclohexyl 2,4,6,-triisopropylbenzene sulfonate, 2-nitrobenzyl tosylate, tris(2,3-dibromopropyl)-1,3,5-triazine-2,4,6-trione, alkylesters and their salts of organic sulfonic acid, triethylamine salt of dodecyl benzene sulfonic acid, or ammonium salt of p-toluene sulfonic acid.

The organic composition may include a surfactant, a leveling agent, and/or a dye compound.

Forming the first photoresist pattern PR1 may include preparing a photoresist composition, applying the photoresist composition to substantially an entire top surface of the substrate 100 to form a photoresist layer, and performing an exposure process and a development process on the photoresist layer to form the first photoresist pattern PR1.

The photoresist composition may include silicon. In some exemplary embodiments of the present inventive concept, the photoresist composition may include a polymer compound that uses siloxane as a backbone and is represented by the chemical formula $(R_1SiO_{3/2})_l(R_2SiO_{3/2})_m(R_3SiO_{3/2})_n$, where each of "$R_1$", "$R_2$", and "$R_3$" independently represents hydrogen, or a substituted or unsubstituted hydrocarbyl group having a carbon number of 1 to 20, "l" is an integral number of 1 to 10, "m" is an integral number of 1 to 10, and "n" is an integral number of 1 to 10. The polymer compound may have a weight average molecular weight of 1,000 to 100,000. A content of silicon may range from 10 wt % to 40 wt % in the first photoresist pattern PR1.

The $(R_1SiO_{3/2})_l$ unit, the $(R_2SiO_{3/2})_m$ unit, and the $(R_3SiO_{3/2})_n$ unit in the polymer compound may be independently represented by the following chemical formula 5.

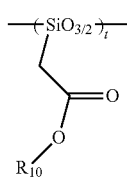

[Chemical formula 5]

In the chemical formula 5, "$R_{10}$" may represent hydrogen, C1-C10 alkyl group, C1-C10 alkenyl group, C1-C10 alkynyl group, C6-C10 aryl group, adamantyl group, C1-C5 alkyl-adamantyl group, or C2-C6 lactone group. "t" is an integral number of 1 to 10.

For example, the polymer compound may include the following polymer represented by the following chemical formula 6. A ratio of l:m:n in the chemical formula 6 is 40:30:30. The polymer of the chemical formula 6 may have a weight average molecular weight (Mw) of 20,000.

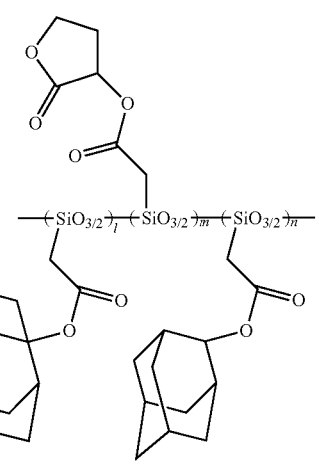

[Chemical formula 6]

In some exemplary embodiments of the present inventive concept, the photoresist composition may include one or more of a radiation-sensitive acid-generating compound, auxiliary resin, a plasticizer, a stabilizer, a coloring agent, and a surfactant.

The first photoresist pattern PR1 may have a second thickness TH2. In some exemplary embodiments of the present inventive concept, the first thickness TH1 may range from about 10 times to about 30 times the second thickness TH2.

Figure 8:
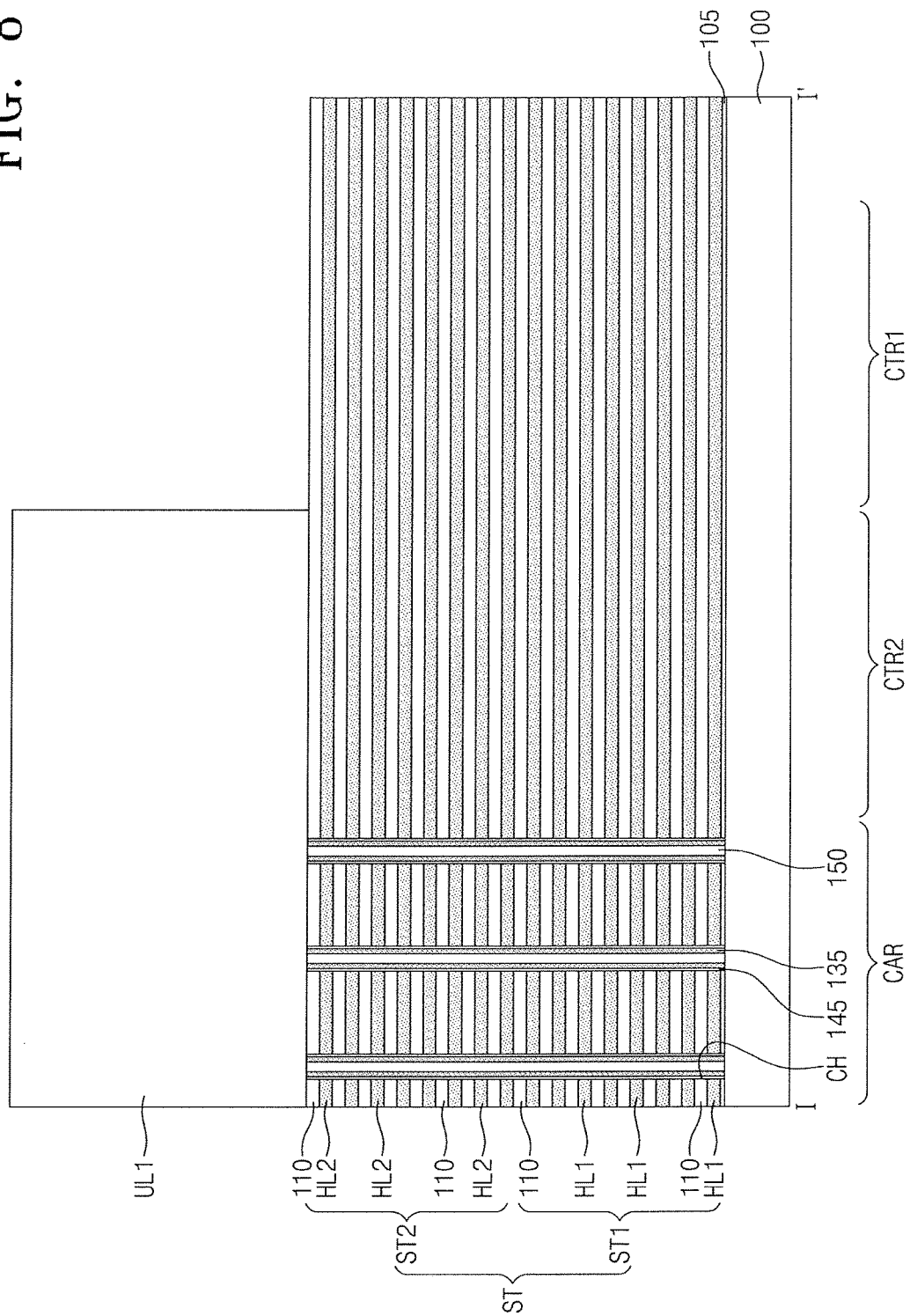

Referring to FIGS. 2 and 8, the first lower layer ULa1 may be anisotropically etched using the first photoresist pattern PR1 as an etch mask to form a first lower pattern UL1. Thus, the first lower pattern UL1 may expose the stack structure ST of the first contact region CTR1.

In some exemplary embodiments of the present inventive concept, the first photoresist pattern PR1 may be completely removed during the anisotropic etching process for forming the first lower pattern UL1. A ratio of an etch rate of the first photoresist pattern PR1 to an etch rate of the first lower layer ULa1 may range from 1:2 to 1:30 during the anisotropic etching process. The second thickness TH2 may be adjusted in consideration of the etch rate ratio, and thus the first photoresist pattern PR1 may be completely removed during the anisotropic etching process. In a case in which a portion of the first photoresist pattern PR1 remains after the anisotropic etching process, an additional process may be performed to remove the remaining portion of the first photoresist pattern PR1.

Due to a great difference between the etch rates of the first photoresist pattern PR1 and the first lower layer ULa1 according to some exemplary embodiments of the present inventive concept, the first lower pattern UL1 may be stably formed even though the second thickness TH2 of the first photoresist pattern PR1 is smaller than the first thickness TH1 of the first lower layer ULa1. An angle between the top surface of the substrate 100 and a sidewall of the first lower pattern UL1 may be about 90 degrees.

Figure 9:
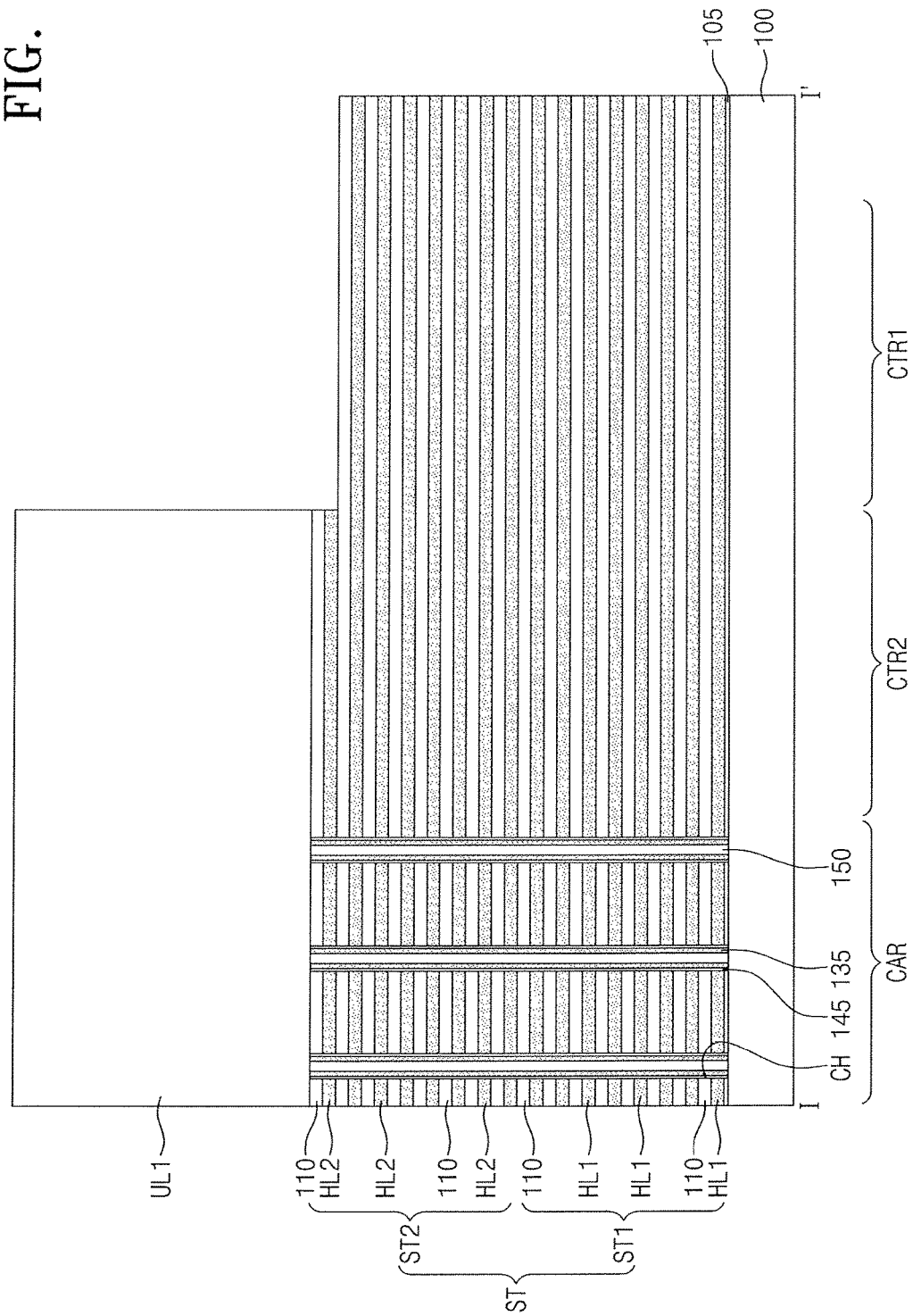

Referring to FIGS. 2 and 9, the uppermost insulating layer 110 and the uppermost second sacrificial layer HL2 of the second stack structure ST2 may be sequentially etched using the first lower pattern UL1 as an etch mask. The etched insulating layer 110 and the etched second sacrificial layer HL2 may expose another insulating layer 110 and another second sacrificial layer HL2 disposed under the uppermost insulating layer 110.

Figure 10:
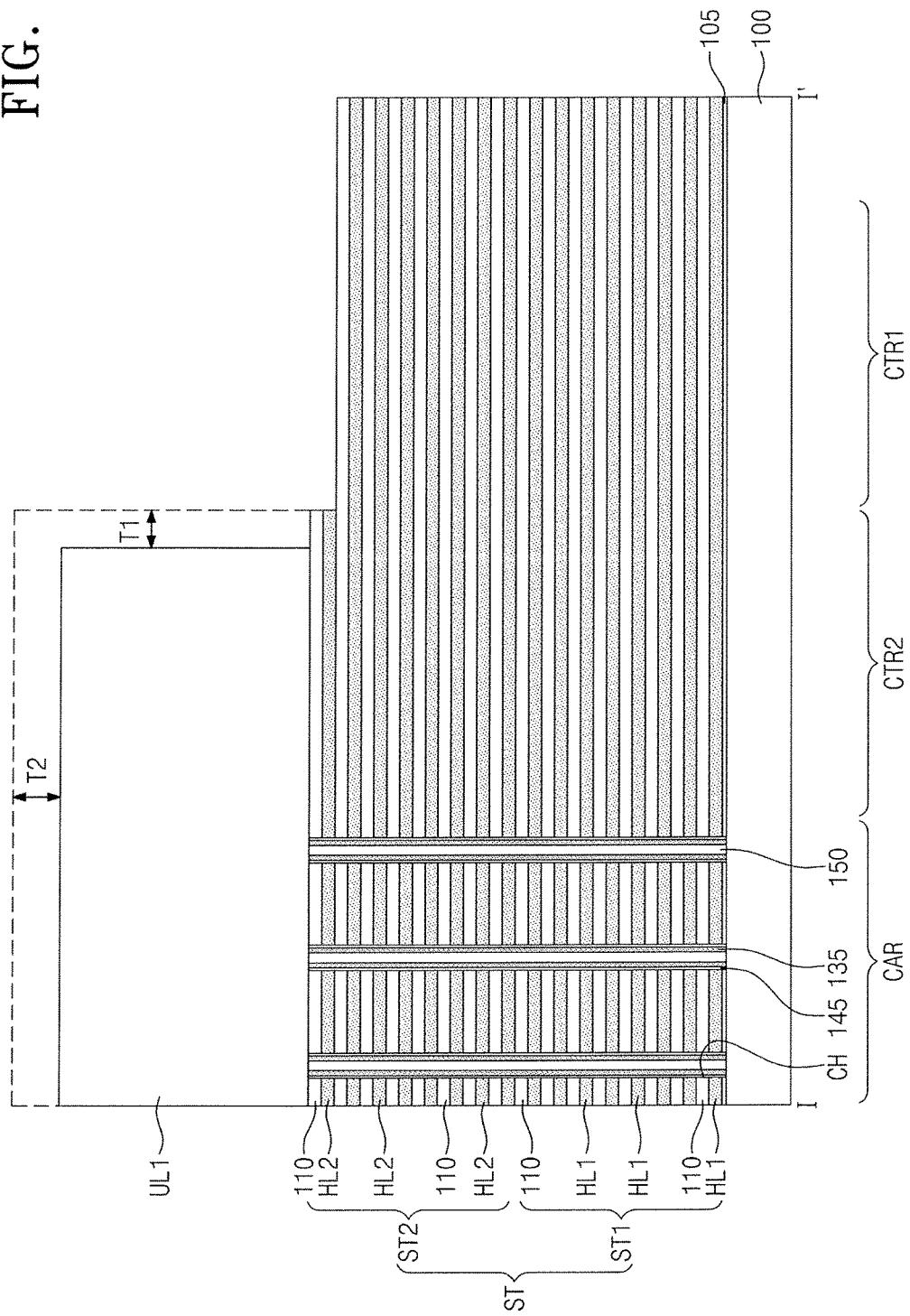

Referring to FIGS. 2 and 10, a trimming process may be performed on the first lower pattern UL1. For example, an isotropic etching process may be performed on the first lower pattern UL1. Thus, a width and a height of the first lower pattern UL1 may be reduced. In some exemplary embodiments of the present inventive concept, during the trimming process, the width of the first lower pattern UL1 may be reduced by a first length T1 and the height of the first lower pattern UL1 may be reduced by a second length T2.

The trimming process may be performed using an etching solution capable of selectively etching the first lower pattern UL1. When the trimming process includes a wet etching process, the reduced length of the height of the first lower pattern UL1 may be greater than the reduced length of the width of the first lower pattern UL1. This may be because an area of the exposed top surface of the first lower pattern UL1 may be greater than that of the exposed sidewall of the first lower pattern UL1.

However, since the first lower pattern UL1 according to some exemplary embodiments of the present inventive concept may be formed using the novolac-based organic polymer, the reduction of the height of the first lower pattern UL1 may be reduced or eliminated. In some exemplary embodiments of the present inventive concept, the second length T2 reduced during the trimming process may be greater than the first length T1 and may be smaller than 1.5 times the first length T1.

The processes described with reference to FIGS. 9 and 10 may constitute one process cycle for forming a stepwise structure of the second stack structure ST2 disposed on the substrate 100 of the second contact region CTR2. The process cycle may include etching at least one insulating layer 110 and at least one second sacrificial layer HL2 using the first lower pattern UL1 as an etch mask, and trimming the first lower pattern UL1 to reduce the width and height of the first lower pattern UL1. The process cycle may be repeatedly performed. Repeated performances of the process cycle will be described below in more detail.

Figure 11:
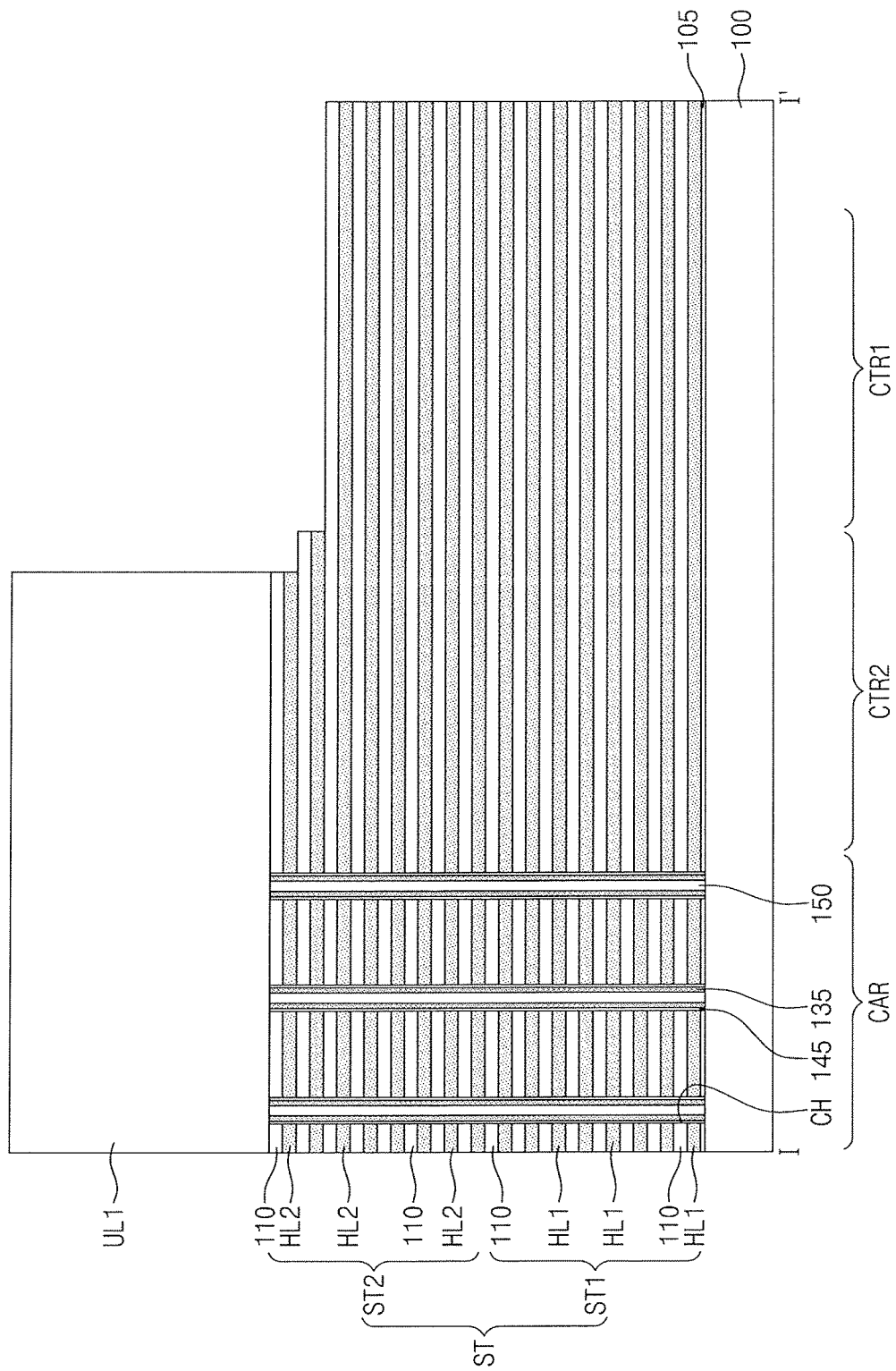

Referring to FIGS. 2 and 11, the uppermost insulating layer 110 may be etched using the first lower pattern UL1, the size of which has been reduced once, as an etch mask. At substantially the same time, the insulating layer 110, which is exposed by and disposed under the uppermost insulating layer 110 and the uppermost second sacrificial layer HL2, may be etched together with the uppermost insulating layer 110. Subsequently, the uppermost second sacrificial layer HL2 may be etched using the first lower pattern UL1 as an etch mask. At substantially the same time, the second sacrificial layer HL2, which is exposed by and disposed under the uppermost second sacrificial layer HL2, may be etched together with the uppermost second sacrificial layer HL2. The etched insulating layers 110 and the etched second sacrificial layers HL2 may expose another insulating layer 110 and another second sacrificial layer HL2 disposed thereunder.

Figure 12:
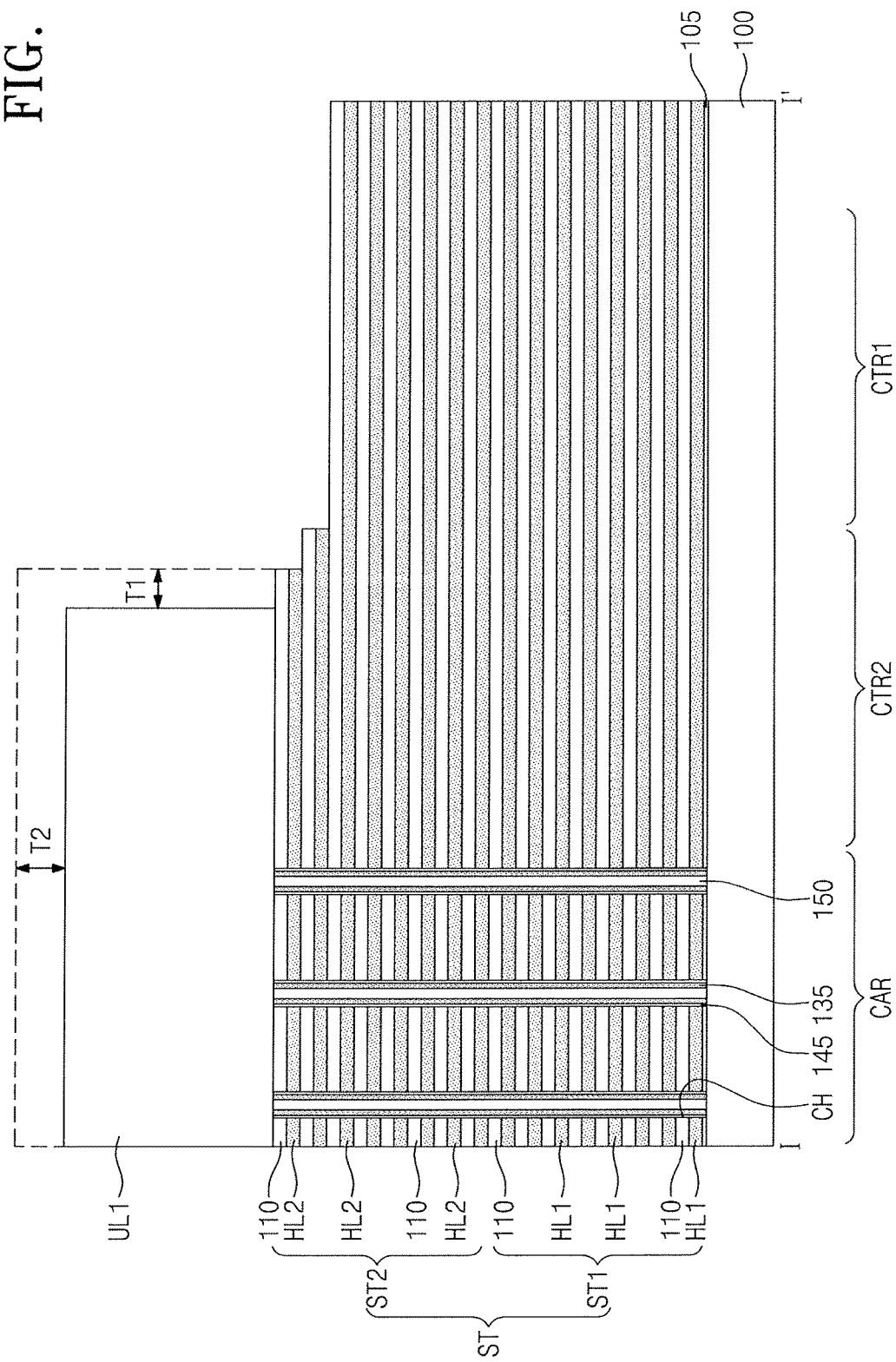

Referring to FIGS. 2 and 12, the trimming process may be performed again on the first lower pattern UL1. During the trimming process, the width of the first lower pattern UL1 may be reduced by the first length T1 and the height of the first lower pattern UL1 may be reduced by the second length T2. Thus, the process cycle may be repeated once more.

Figure 13:
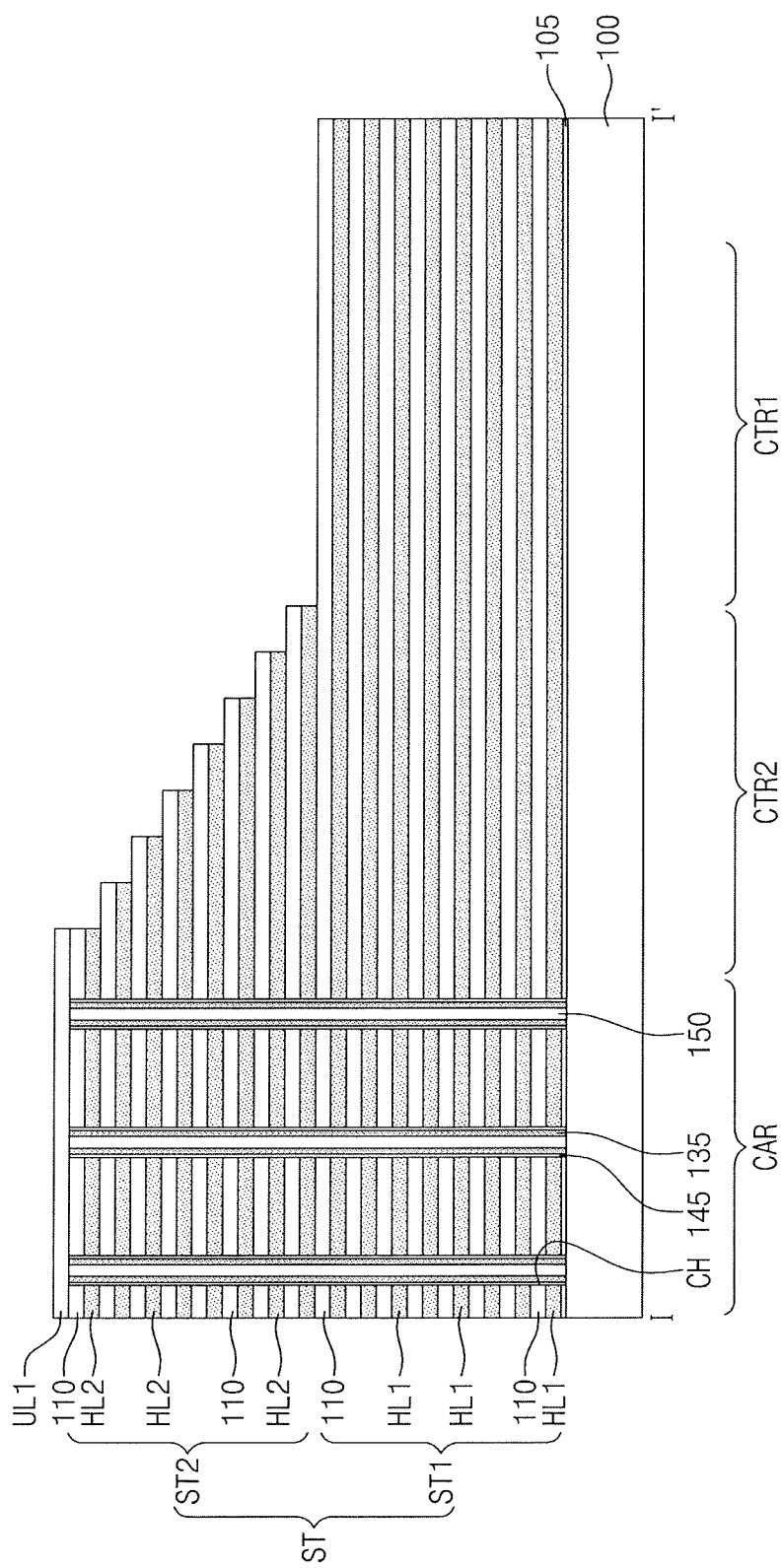

Referring to FIGS. 2 and 13, the process cycle may be repeated until the lowermost insulating layer 110 and the lowermost second sacrificial layer HL2 of the second stack structure ST2 disposed on the substrate 100 of the second contact region CTR2 are etched. Thus, the uppermost insulating layer 110 of the first stack structure ST1 on the substrate 100 of the first contact region CTR1 may be exposed.

An end portion of the second stack structure ST2 disposed on the substrate 100 of the second contact region CTR2 may have the stepwise structure formed by repeatedly performing the process cycle using the first lower pattern UL1. The size of the first lower pattern UL1 may become relatively small by the repeated trimming processes when the end portion of the second stack structure ST2 disposed on the substrate 100 of the second contact region CTR2 has the stepwise structure.

Figure 14:
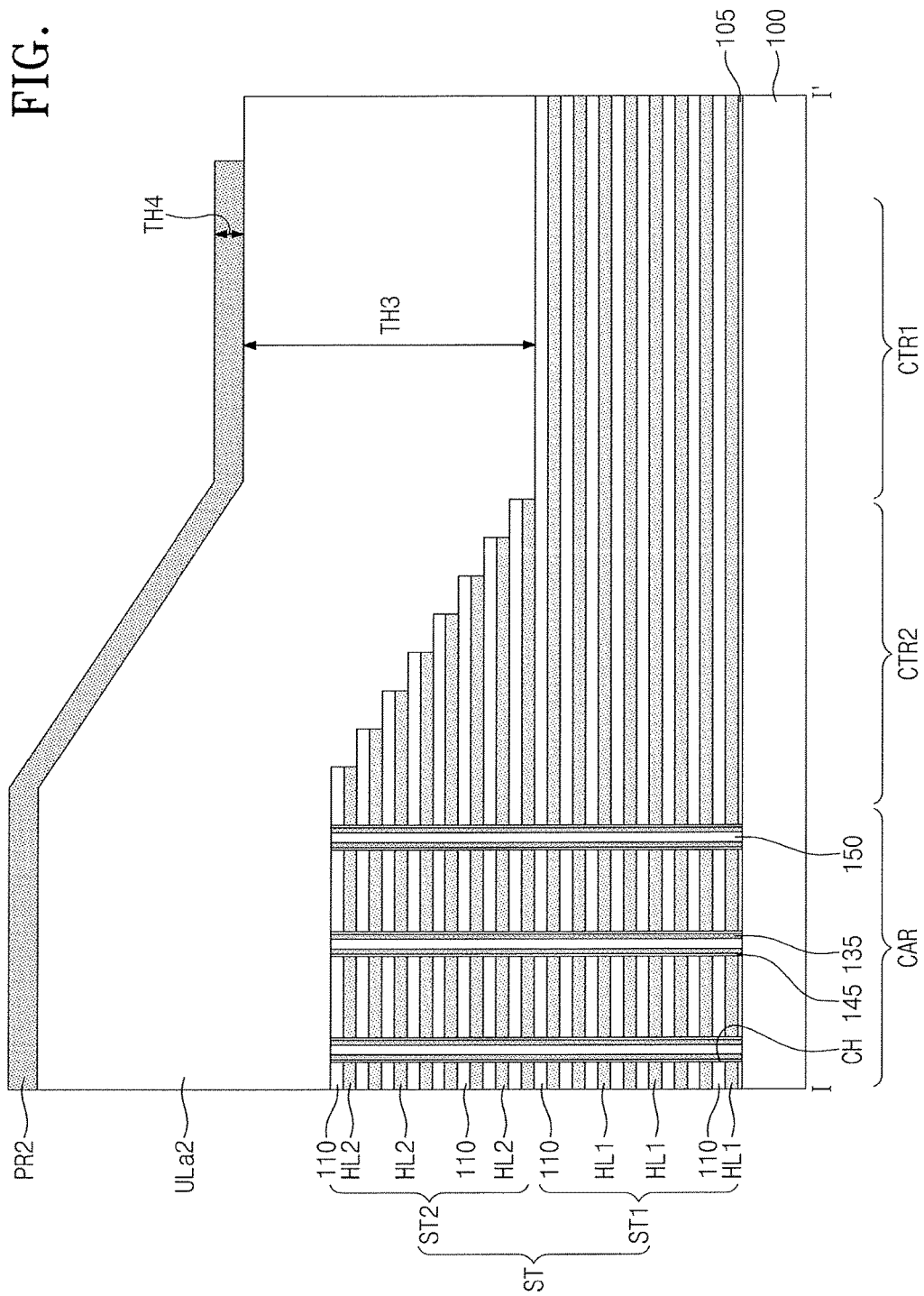

Referring to FIGS. 2 and 14, the first lower pattern UL1 remaining on the stack structure ST may be removed, and then, a second lower layer ULa2 covering the stack structure ST may be formed. The second lower layer ULa2 may be formed by coating substantially an entire top surface of the stack structure ST with the organic composition described above. The second lower layer ULa2 may have a substantially uniform thickness, and thus the second lower layer ULa2 of the second contact region CTR2 may have a sloped top surface. The second lower layer ULa2 may have a third thickness TH3.

A second photoresist pattern PR2 may be formed on the second lower layer ULa2. The second photoresist pattern PR2 may be formed on the second lower layer ULa2 of the cell array region CAR, the second contact region CTR2, and the first contact region CTR1. The second photoresist pattern PR2 may be formed using the photoresist composition including silicon. The second photoresist pattern PR2 may have a fourth thickness TH4. In some exemplary embodiments of the present inventive concept, the third thickness TH3 may range from 10 times to 30 times the fourth thickness TH4.

Figure 15:
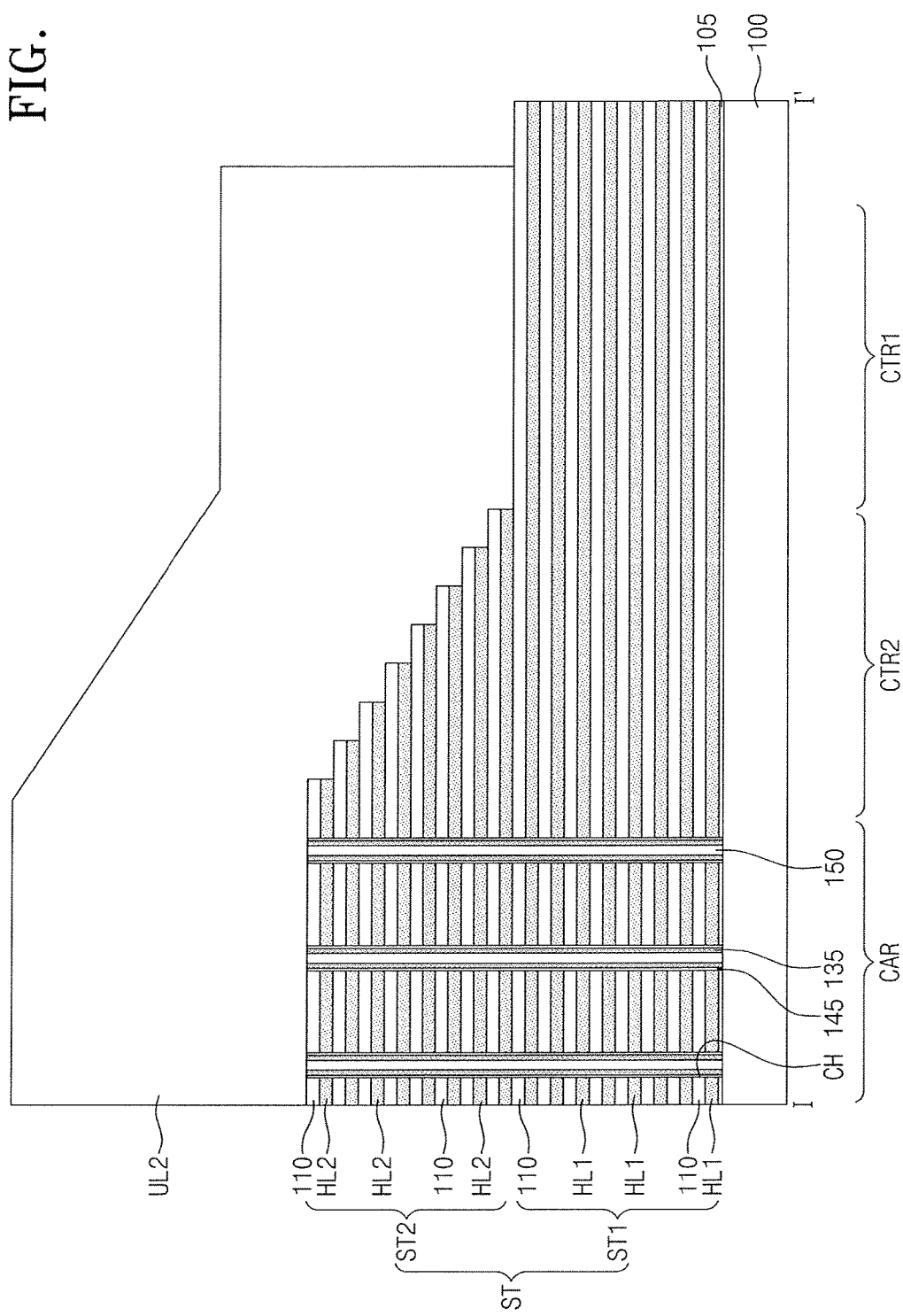

Referring to FIGS. 2 and 15, the second lower layer ULa2 may be anisotropically etched using the second photoresist pattern PR2 as an etch mask to form a second lower pattern UL2. The second lower pattern UL2 may expose the insulating layers 110 and the first sacrificial layers HL1 outside the cell array region CAR and the first and second contact regions CTR1 and CTR2. The second photoresist pattern PR2 may be completely removed during the anisotropic etching process for forming the second lower pattern UL2.

Figure 16:
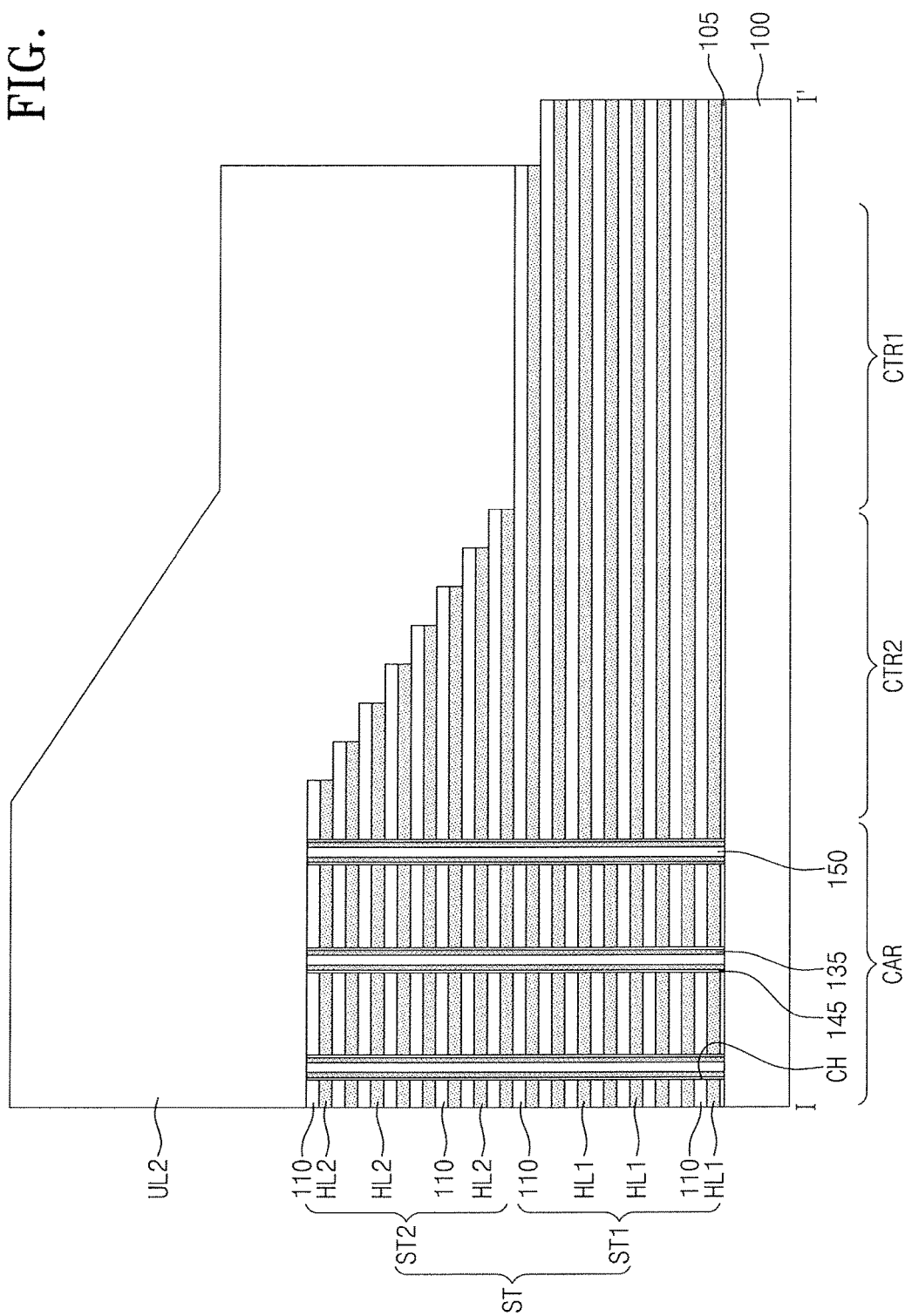

Referring to FIGS. 2 and 16, the uppermost insulating layer 110 and the uppermost first sacrificial layer HL1 of the first stack structure ST1 of the first contact region CTR1 may be sequentially etched using the second lower pattern UL2 as an etch mask. The etched insulating layer 110 and the etched first sacrificial layer HL1 of the first stack structure ST1 may expose another insulating layer 110 and another first sacrificial layer HL1 disposed under the uppermost insulating layer 110.

Figure 17:
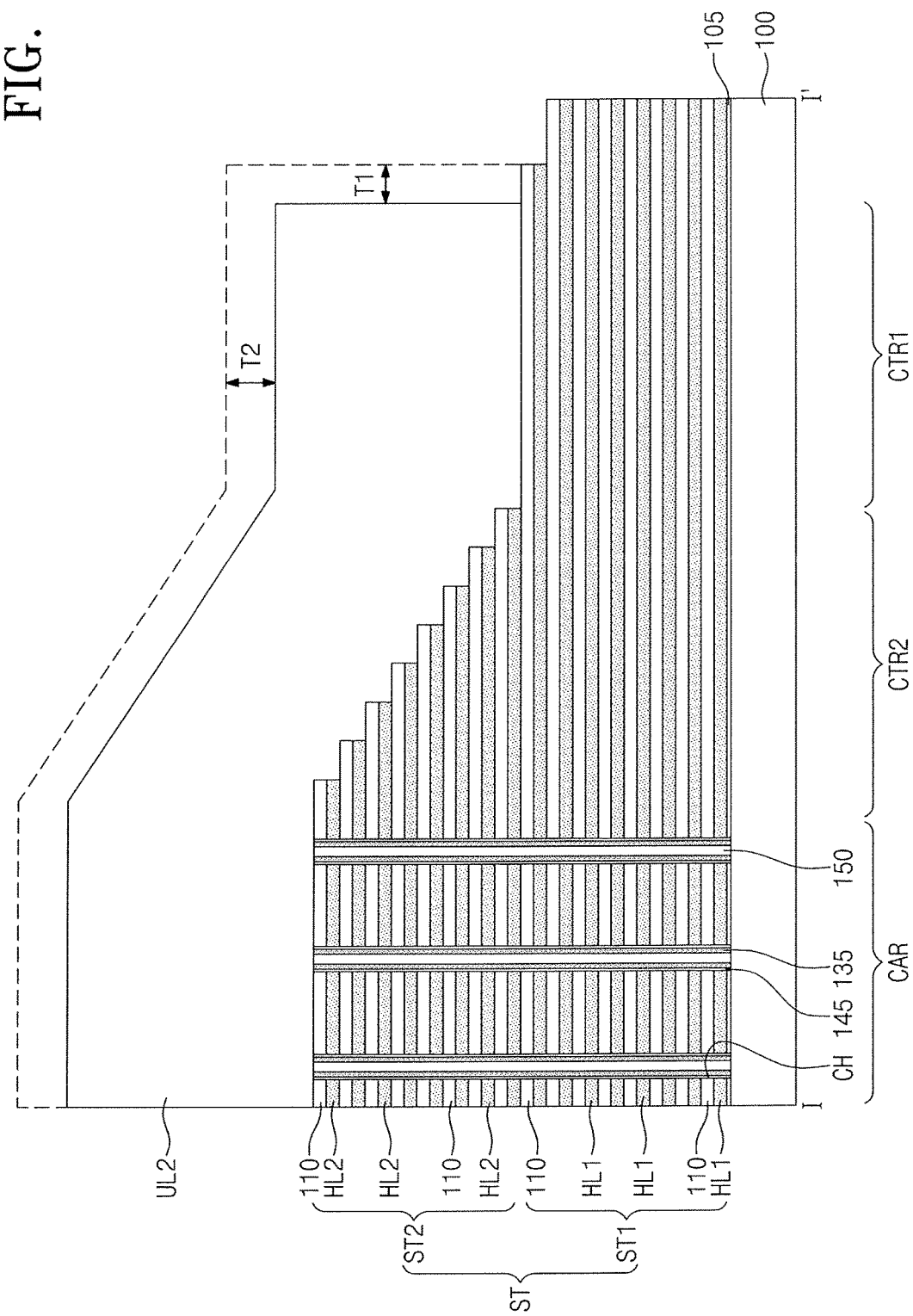

Referring to FIGS. 2 and 17, the trimming process may be performed on the second lower pattern UL2. During the trimming process, a width of the second lower pattern UL2 may be reduced by a first length T1 and a height of the second lower pattern UL2 may be reduced by a second length T2.

The processes described with reference to FIGS. 16 and 17 may be substantially the same as the one process cycle described with reference to FIGS. 9 and 10. The process cycle may be repeated. Repeated performances of the process cycle will be described below in more detail.

Figure 18:
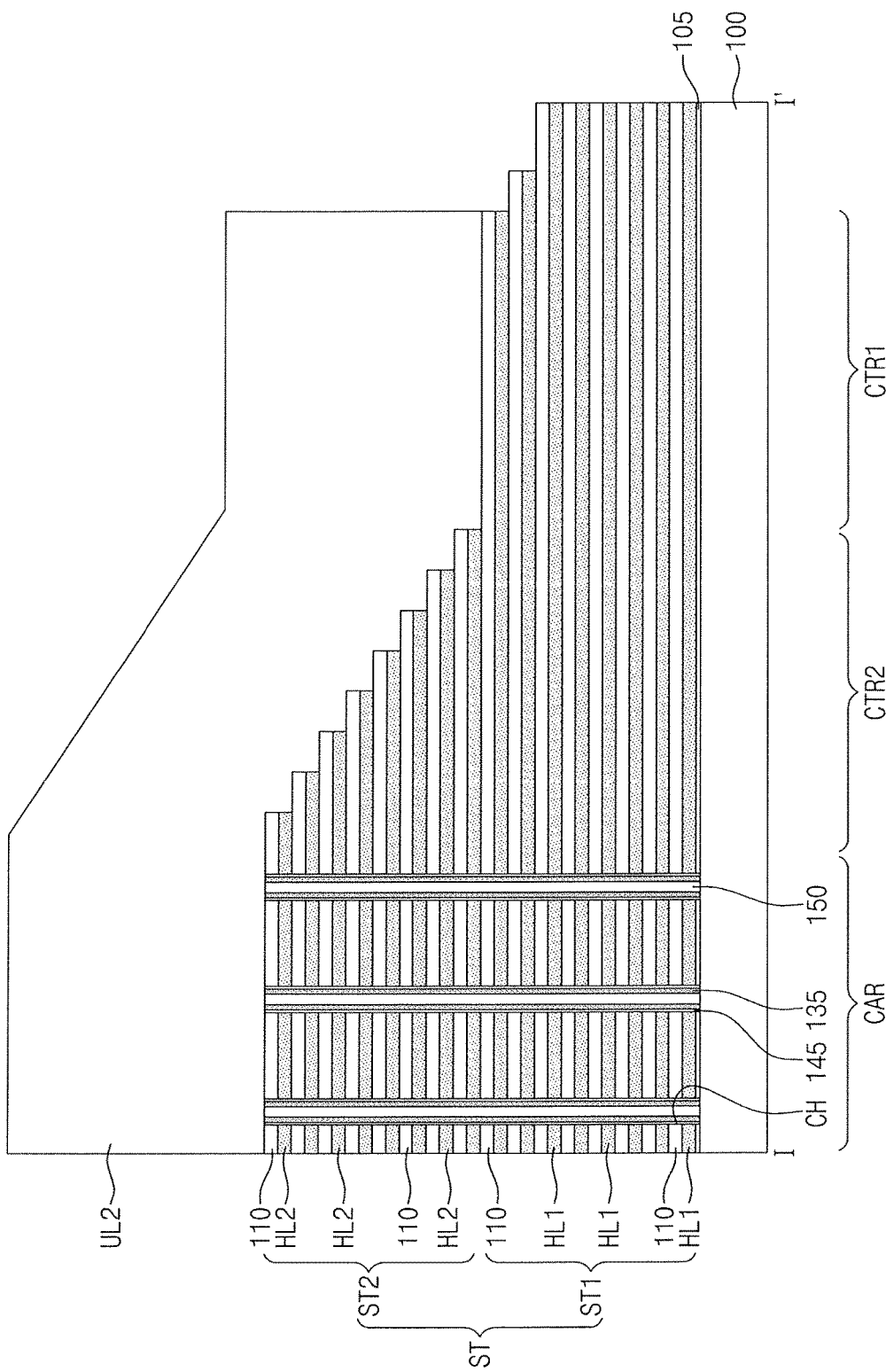

Referring to FIGS. 2 and 18, the uppermost insulating layer 110 of the first stack structure ST1 may be etched using the second lower pattern UL2, the size of which is reduced once, as an etch mask. At substantially the same time, the insulating layer 110 exposed by and disposed under the uppermost insulating layer 110 and the uppermost first sacrificial layer HL1 may also be etched. Subsequently, the uppermost first sacrificial layer HL1 may be etched using the second lower pattern UL2 as an etch mask. At substantially the same time, the first sacrificial layer HL1 exposed by and disposed under the uppermost first sacrificial layer HL1 may also be etched.

Figure 19:
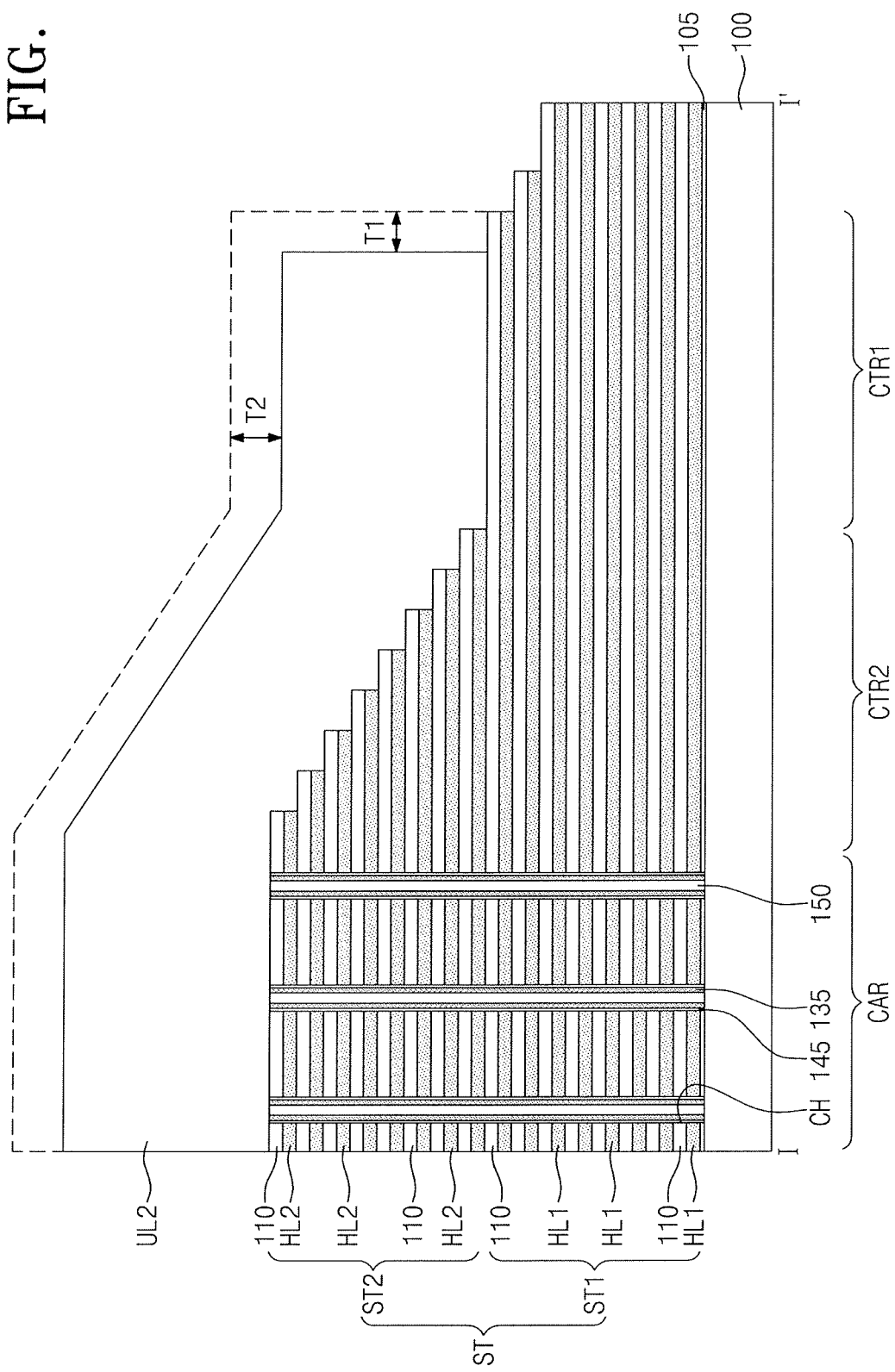

Referring to FIGS. 2 and 19, the trimming process may be performed again on the second lower pattern UL2. Thus, the process cycle may be performed once more.

Figure 20:
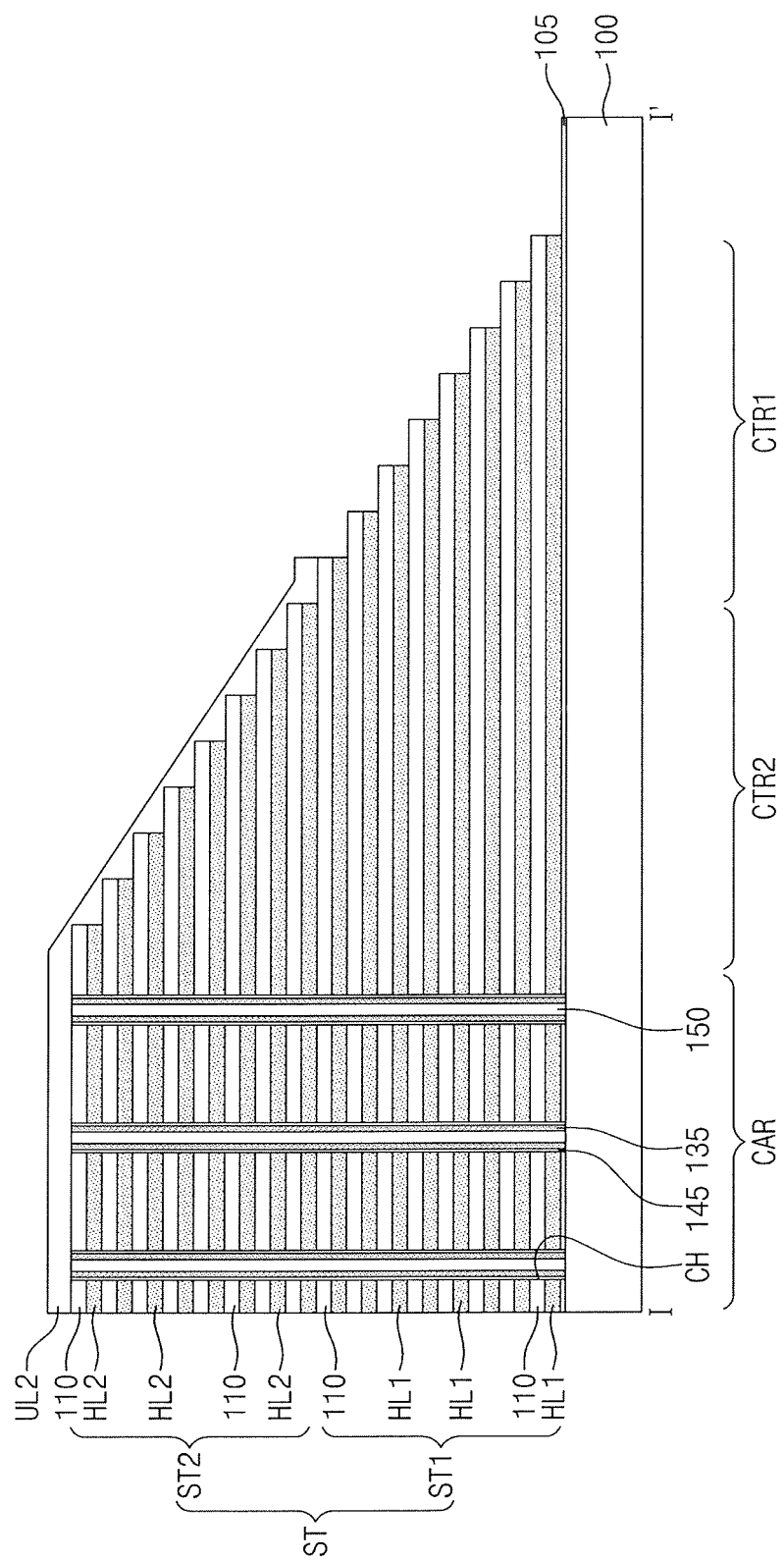

Referring to FIGS. 2 and 20, the process cycle using the second lower pattern UL2 may be repeated until the lowermost insulating layer 110 and the lowermost first sacrificial layer HL1 of the first stack structure ST1 of the first contact region CTR1 are etched. Thus, a portion of a top surface of the lower insulating layer 105 may be exposed. An end portion of the first stack structure ST1 disposed on the substrate 100 of the first contact region CTR1 may have a stepwise structure formed by repeatedly performing the process cycle using the second lower pattern UL2. The size of the second lower pattern UL2 may become relatively small after the repeated trimming processes when the end portion of the first stack structure ST1 disposed on the substrate 100 of the first contact region CTR1 has the stepwise structure.

Figure 21:
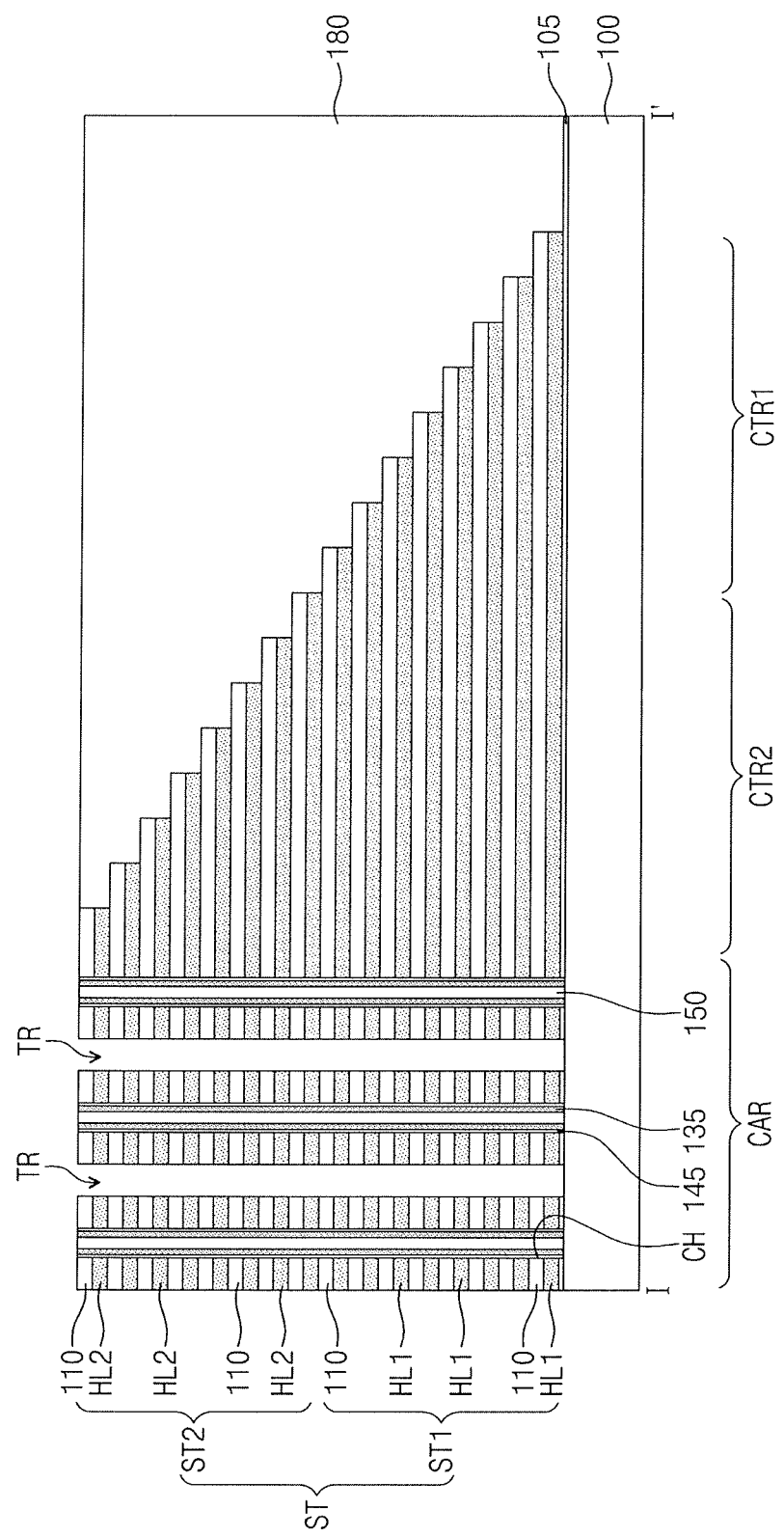

Referring to FIGS. 2 and 21, a remaining second lower pattern UL2 may be removed, and a first interlayer insulating layer 180 covering the stack structure ST may be formed on the substrate 100. The first interlayer insulating layer 180 may cover the stepwise structures of the first and second stack structures ST1 and ST2 disposed on the substrate 100 of the first and second contact regions CTR1 and CTR2. The first interlayer insulating layer 180 may be planarized to expose the top surface of the second stack structure ST2 of the cell array region CAR.

The stack structure ST of the cell array region CAR may be patterned to form trenches TR exposing the substrate 100. The trenches TR may be laterally spaced apart from the channel holes CH. In some exemplary embodiments of the present inventive concept, the formation of the trenches TR may include forming a mask pattern defining planar positions of the trenches TR on the stack structure ST, and etching the stack structure ST using the mask pattern as an etch mask.

The trenches TR may expose sidewalls of the sacrificial layers HL1 and HL2 and sidewalls of the insulating layers 110. The trenches TR may be formed to expose sidewalls of the lower insulating layer 105. A width of the trench TR may be varied according to a vertical distance from the substrate 100.

The stack structure ST may be divided into a plurality of sub-stack structures ST by the trenches TR. Each of the sub-stack structures ST may have a linear shape extending in the second direction D2. A plurality of the channel layers 135 may penetrate each of the sub-stack structures ST.

Figure 22:
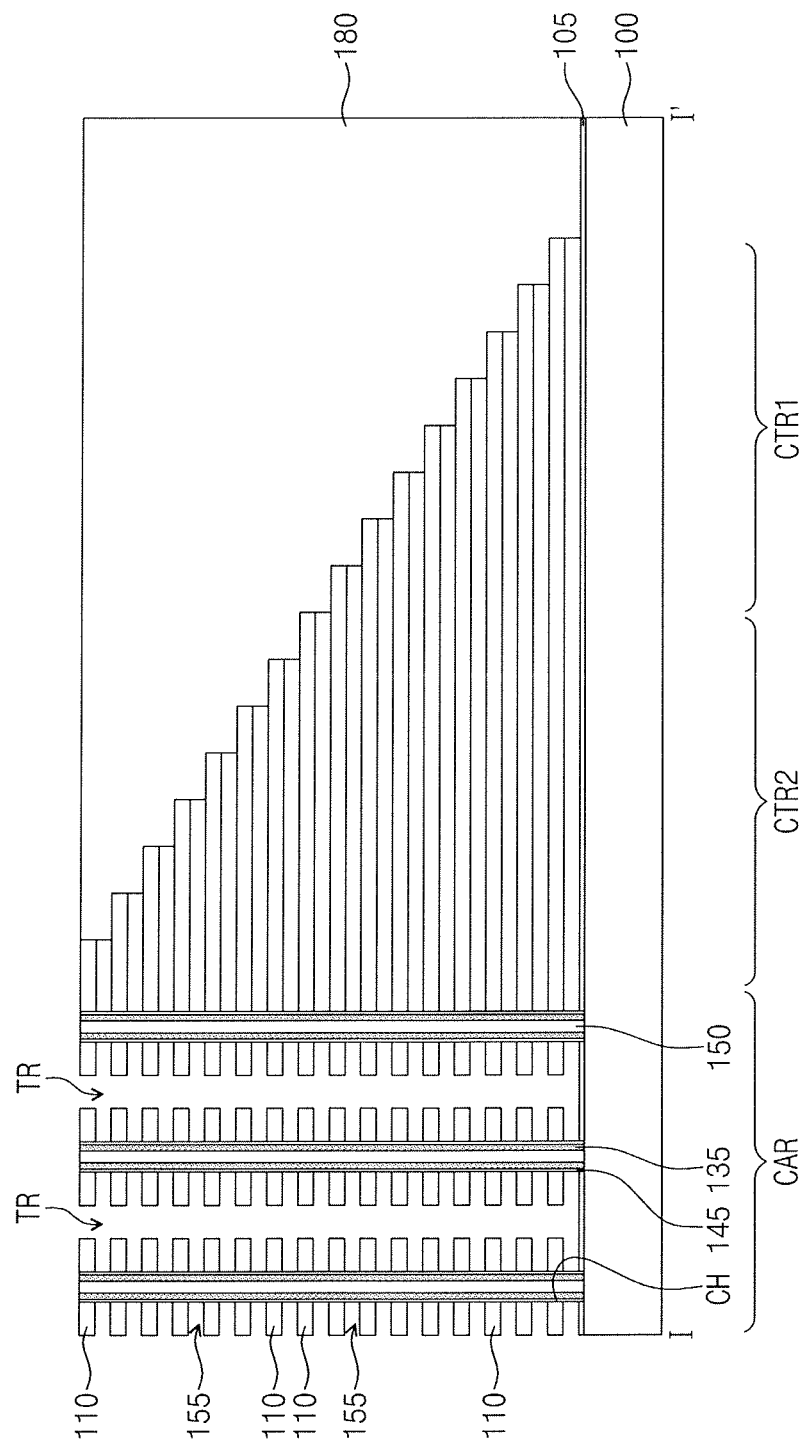

Referring to FIGS. 2 and 22, the sacrificial layers HL1 and HL2 exposed by the trenches TR may be selectively removed to form recess regions 155. The recess regions 155 may correspond to empty regions formed by removing the sacrificial layers HL1 and HL2. In a case in which the sacrificial layers HL1 and HL2 include silicon nitride layers or silicon oxynitride layers, the removal process of the sacrificial layers HL1 and HL2 may be performed using an etching solution including phosphoric acid. Portions of a sidewall of the gate insulating layer 145 may be exposed through the recess regions 155, respectively.

Figure 23:
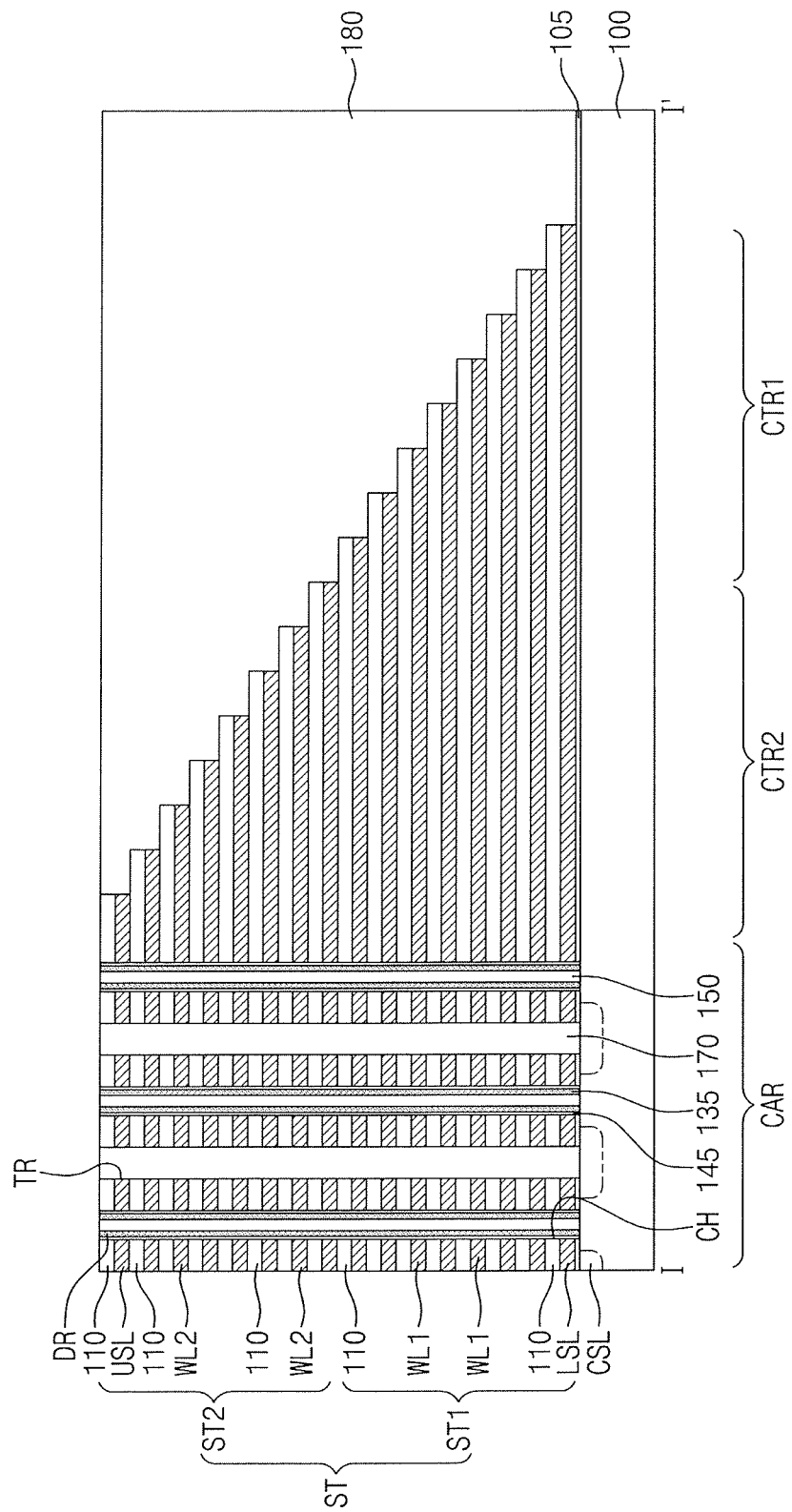

Referring to FIGS. 2 and 23, gate electrodes LSL, WL1, WL2, and USL may be formed to fill the recess regions 155, respectively. In some exemplary embodiments of the present inventive concept, the formation of the gate electrodes LSL, WL1, WL2, and USL may include forming a conductive layer filling the recess regions 155 on the substrate 100, and removing the conductive layer formed outside the recess regions 155.

After the formation of the gate electrodes LSL, WL1, WL2, and USL, common source regions CSL may be formed in the substrate 100. The common source regions CSL may be formed using an ion implantation process and may be formed in the substrate 100 under the trenches TR. The common source region CSL and the substrate 100 may form a PN junction. Drain regions DR may be formed in top end portions of the channel layers 135 by an ion implantation process.

When the gate insulating layer 145 includes the tunnel insulating layer and the charge storage layer, a blocking insulating layer may be conformally formed on inner surfaces of the recess regions 155 before the formation of the gate electrodes LSL, WL1, WL2, and USL. The gate electrodes LSL, WL1, WL2, and USL may be formed to fill the recess regions 155 in which the blocking insulating layer is formed.

Referring again to FIGS. 2 and 3, the filling insulation layer 170 may be formed to fill the trenches TR. The filling insulation layer 170 may include a silicon oxide layer.

Conductive pads 160 may be formed on the channel layers 135, respectively. The conductive pads 160 may be in contact with the top surfaces of the channel layers 135, respectively. A second interlayer insulating layer 190 may be formed to cover the filling insulation layer 170, the conductive pads 160, and the first interlayer insulating layer 180. Bit line plugs BPLG may be formed to penetrate the second interlayer insulating layer 190. The bit line plugs BPLG may be in contact with the conductive pads 160, respectively.

First contact plugs PLG1 may be formed to penetrate the second and first interlayer insulating layers 190 and 180. The first contact plugs PLG1 may be connected to the gate electrodes LSL and WL1 of the first contact region CTR1, respectively. Second contact plugs PLG2 may be formed to penetrate the second and first interlayer insulating layers 190 and 180. The second contact plugs PLG2 may be connected to the gate electrodes WL2 and USL of the second contact region CTR2, respectively.

Bit lines BL extending in first direction D1 may be formed on the second interlayer insulating layer 190. Each of the bit lines BL may be connected to a plurality of the bit line plugs BPLG arranged in the first direction D1. First and second connection lines CL1 and CL2 respectively connected to the first and second contact plugs PLG1 and PLG2 may be formed on the second interlayer insulating layer 190.

According to some exemplary embodiments of the present inventive concept, distribution and profile consistency of the lower pattern may be increased using the bi-layer process of the photoresist pattern and the lower layer. Since the lower pattern may be relatively thickly formed, the stepwise pattern having a plurality of steps may be formed using one photolithography process. Thus, the processes of manufacturing the semiconductor device may be efficiently managed and effectively simplified.

Figure 24:
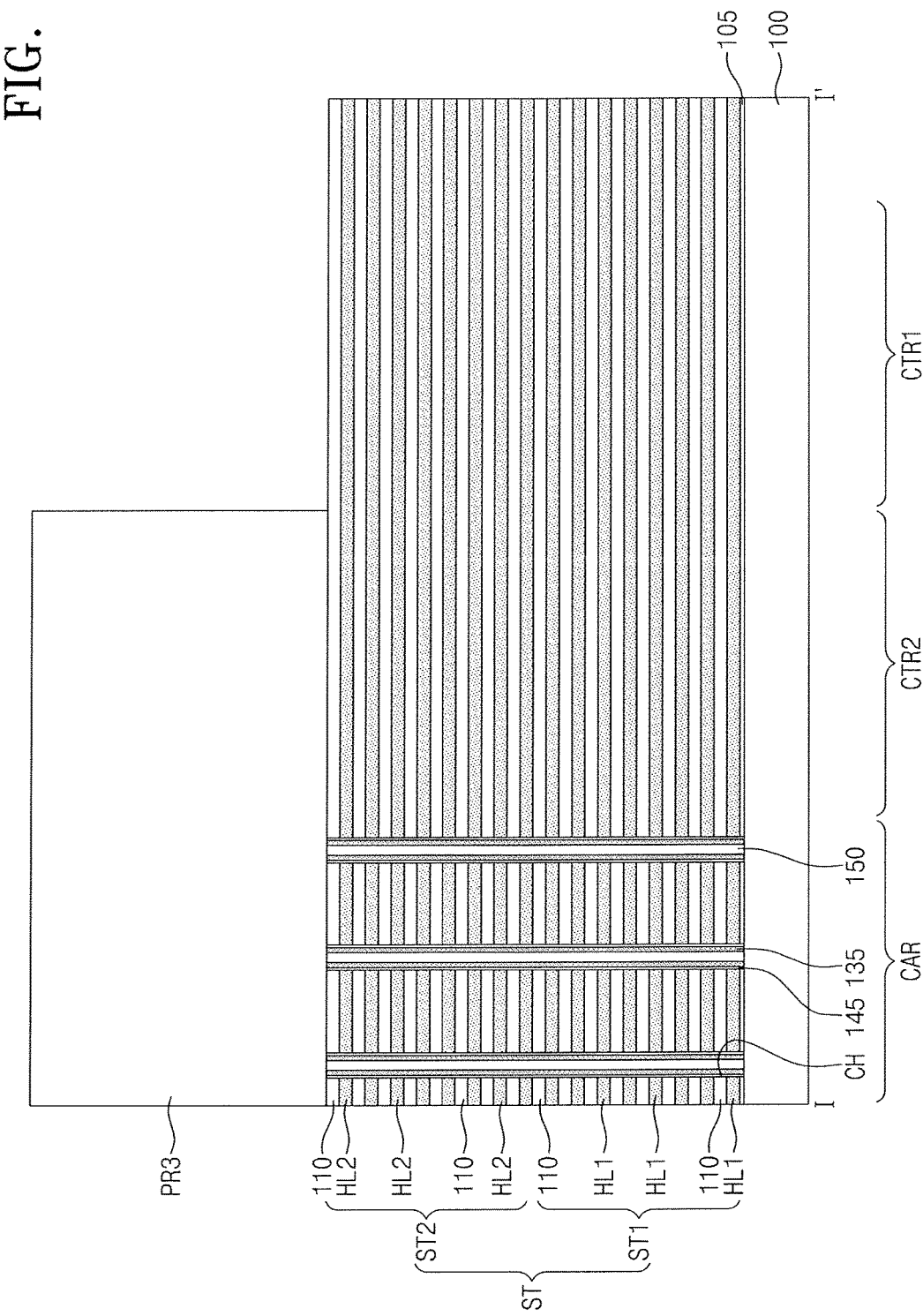
FIGS. 24 to 26 are cross-sectional views taken along the line I-I' of FIG. 2 illustrating a method for manufacturing a 3D semiconductor memory device according to some exemplary embodiments of the present inventive concept.
Figure 25:
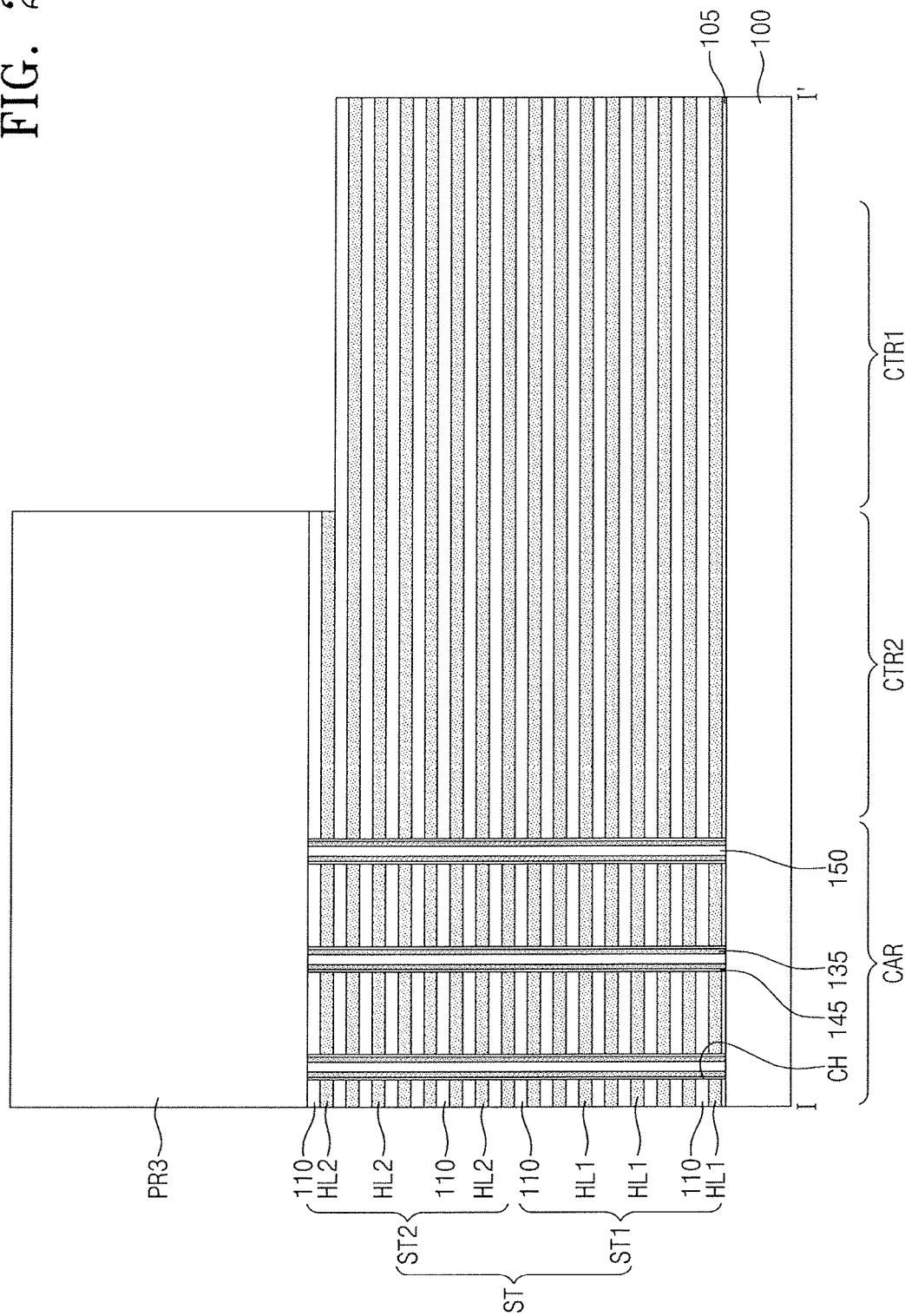
Figure 26:
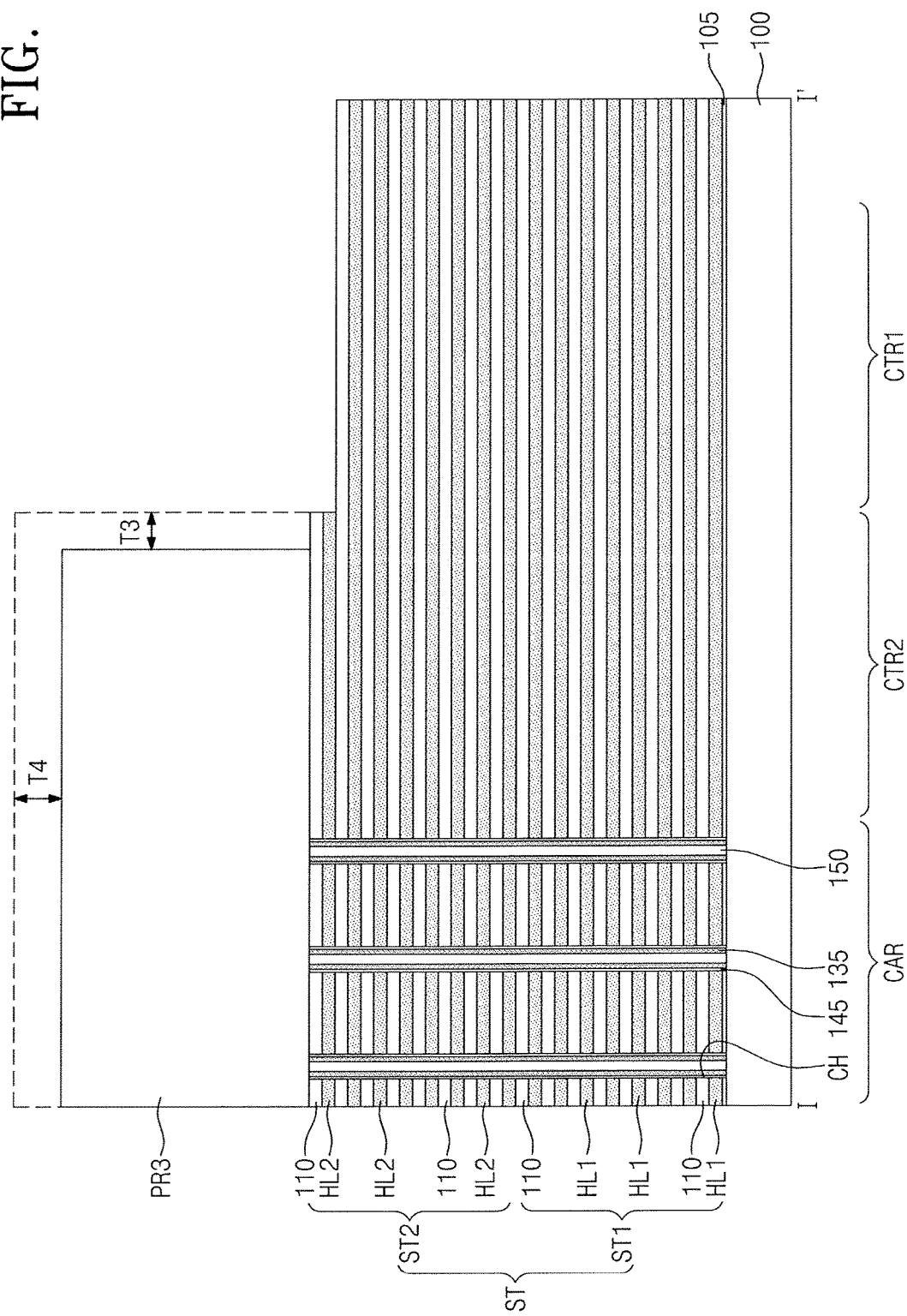

FIGS. 24 to 26 are cross-sectional views taken along the line I-I' of FIG. 2 illustrating a method for manufacturing a 3D semiconductor memory device according to some exemplary embodiments of the present inventive concept. The descriptions to the same technical features as those described above with reference to FIGS. 4 to 23 maybe omitted or mentioned briefly.

Referring to FIGS. 2, 6 and 24, a third photoresist pattern PR3 may be formed on the resultant structure of FIG. 6. The first lower layer ULa1 may be omitted and the third photoresist pattern PR3 may be disposed directly on and may cover the top surface of the second stack structure ST2. The third photoresist pattern PR3 may be formed on the stack structure ST of the cell array region CAR and the second contact region CTR2. The third photoresist pattern PR3 may expose the stack structure ST of the first contact region CTR1.

Forming the third photoresist pattern PR3 may include preparing a photoresist composition, applying the photoresist composition to an entire top surface of the substrate 100 to form a photoresist layer, and performing an exposure process and a development process on the photoresist layer to form the third photoresist pattern PR3.

The photoresist composition according to an exemplary embodiment of the present inventive concept may include a poly(4-hydroxystyrene) (PHS)-based organic polymer. Preparing the photoresist composition may include polymerizing a mixture containing a substituted or unsubstituted 4-hydroxystyrene and a substituted acrylate to synthesize a copolymer. The 4-hydroxystyrene or the acrylate may be substituted with hydrocarbyl group explained in detail below. Here, before the polymerization, a weight ratio of the 4-hydroxystyrene to the acrylate may range from 95:5 to 60:40. For example, the weight ratio of the 4-hydroxystyrene to the acrylate in the mixture may be in a range of 90:10 to 80:20.

The synthesized copolymer may include units represented by the following chemical formulas 2 and 3 and optionally unit represented by the following chemical formula 4.

[Chemical formula 2]

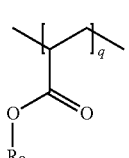

[Chemical formula 3]

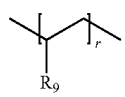

[Chemical formula 4]

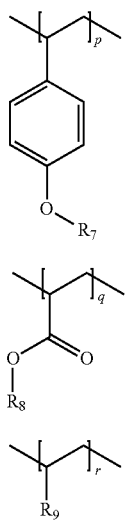

In the chemical formulas 2 to 4, each of "$R_7$," "$R_8$," and "$R_9$" independently represents hydrogen or a substituted or unsubstituted hydrocarbyl group having a carbon number of 1 to 20. The hydrocarbyl group may be selected from a group consisting of alkyl group, alkenyl group, alkynyl group, cycloalkyl group, alkyl substituted cycloalkyl group, aryl group, aralkyl group, and alkaryl group. The hydrocarbyl group may be substituted with a group represented by —O—$R_{11}$. "$R_{11}$" may be C1-C10 alkyl, C2-C10 alkenyl, C2-C10 alkynyl, C6-C10 aryl or C3-C10 cycloalkyl. For example, the hydrocarbyl group may be substituted with alkoxy group. The hydrocarbyl group may be an alkyl ether having one or more alkyl ether groups or alkylene oxy groups. The alkyl ether groups may be selected from a group consisting of ethoxy, propoxy, and butoxy groups. In the chemical formulas 2 to 4, "p" is an integral number of 1 to 10, "q" is an integral number of 1 to 10, and "r" is an integral number of 1 to 10. A ratio of p/(p+q+r) may be in a range from 0.4 to 0.6, a ratio of q/(p+q+r) may be in a range from 0.5 to 0.2, and a ratio of r/(p+q+r) may be in a range from 0.2 to 0.4. The copolymer may have a weight average molecular weight of 1,000 to 100,000.

For example, the copolymer may include the following polymer represented by the following chemical formula 7. A ratio of p:q:r in the chemical formula 7 is 55:15:30. The copolymer of the chemical formula 7 may have a weight average molecular weight (Mw) of 15,000. The copolymer of the chemical formula 7 may be made by free radical polymerization but not limited thereto. The copolymer may be polymerized by anion polymerization.

[Chemical formula 7]

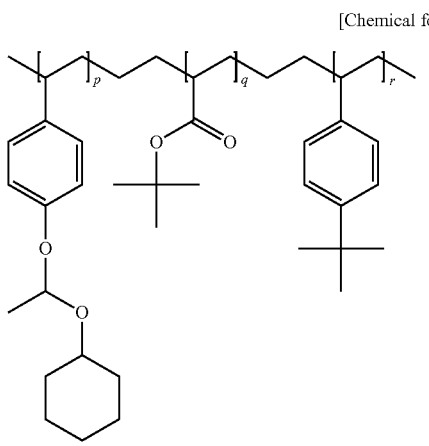

Preparing the photoresist composition may include mixing the synthesized copolymer with a radiation-sensitive acid-generating compound and trialkanolamine in an organic solvent.

The radiation-sensitive acid-generating compound may be dissociated by irradiation of active light, thereby generating an acid. The radiation-sensitive acid-generating compound may include an onium salt compound that contains fluoro-alkyl-sulfonate ions having a carbon number of 1 to 10 as negative ions. For example, the radiation-sensitive acid-generating compound may include diphenyliodonium trifluoromethanesulfonate and nonafluorobutanesulfonate, or may include bis(4-tert-butylphenyl)iodonium trifluoromethanesulfonate and nonafluorobutanesulfonate.

The trialkanolamine may increase a cross-sectional profile consistency and stability of the photoresist pattern after the exposure process using the active light. For example, the trialkanolamine may include trimethylamine, triethylamine, tri-n-propylamine, triisopropylamine, tri-n-butylamine, triisobutylamine, tri-tert-butylamine, tripentylamine, triethanolamine, tributanolamine, or any combination thereof.

In the photoresist composition, with respect to 100 parts by weight of the copolymer, the radiation-sensitive acid-generating compound may be in a range of 1 part by weight to 10 parts by weight and the trialkanolamine may be in a range of 0.01 parts by weight to 1 part by weight.

In some exemplary embodiments of the present inventive concept, to increase performance of the photoresist layer, auxiliary resin, a plasticizer, a stabilizer, a coloring agent, and a surfactant may be added to the photoresist composition.

Referring to FIGS. 2 and 25, the uppermost insulating layer 110 and the uppermost second sacrificial layer HL2 of the second stack structure ST2 of the second contact region CTR2 may be sequentially etched using the third photoresist pattern PR3 as an etch mask. The etched insulating layer 110 and the etched second sacrificial layer HL2 may expose another insulating layer 110 and another second sacrificial layer HL2 disposed below the uppermost insulating layer 110.

Referring to FIGS. 2 and 26, a trimming process may be performed on the third photoresist pattern PR3. An isotropic etching process may be performed on the third photoresist pattern PR3. Thus, a width and a height of the third photoresist pattern PR3 may be reduced. In some embodiments, during the trimming process, the width of the third photoresist pattern PR3 may be reduced by a third length T3 and the height of the third photoresist pattern PR3 may be reduced by a fourth length T4.

The trimming process may be performed using an etching solution capable of selectively etching the third photoresist pattern PR3. Since the third photoresist pattern PR3 may be formed using the PHS-based photoresist composition according to some exemplary embodiments of the present inventive concept, the reduction of the height of the third photoresist pattern PR3 may be reduced or eliminated. In some exemplary embodiments of the present inventive concept, the fourth length T4 may be greater than the third length T3 and may be smaller than 1.5 times the third length T3. This may be similar to the result of the trimming process of the first lower pattern UL1 described with reference to FIG. 10.

The processes described with reference to FIGS. 25 and 26 may constitute one process cycle for forming the second stack structure ST2 of the second contact region CTR2 into the stepwise structure. The process cycle may be repeated until the lowermost insulating layer 110 and the lowermost second sacrificial layer HL2 of the second stack structure ST2 of the second contact region CTR2 are etched. The processes described with reference to FIGS. 14 to 23 may be performed after the lowermost insulating layer 110 and the lowermost second sacrificial layer HL2 of the second stack structure ST2 of the second contact region CTR2 are etched.

According to an exemplary embodiment of the present inventive concept, the stepwise structure of the second contact region CTR2 may be formed using the PHS-based photoresist pattern PR3 without an additional lower layer. Thus, the processes of manufacturing the semiconductor device may be effectively simplified. However, the bi-layer process of the photoresist pattern and the lower layer may be performed when the stepwise structure of the first contact region CTRL is formed. This may be because the bi-layer process may reduce or prevent inconsistencies or errors in a pattern which may be caused by a stepped structure of the second contact region CTR2.

According to some exemplary embodiments of the present inventive concept, the distribution and profile consistency of the lower pattern may be increased using the bi-layer process of the photoresist pattern and the lower layer. The relatively thick lower pattern may be formed using the organic polymer layer having a relatively high etch selectivity with respect to the photoresist pattern. Thus, the stepwise structure having a plurality of steps may be formed using one photolithography process, thus simplifying the processes of manufacturing the 3D semiconductor memory device.

While the present inventive concept has been particularly shown and described with reference to exemplary embodiments thereof, it will be understood by those of ordinary skill in the art that various changes in form and detail may be made therein without departing from the spirit and scope of the present inventive concept.

What is claimed is:

1. A method for manufacturing a semiconductor device, the method comprising:
  forming a stack structure including insulating layers and sacrificial layers which are alternately and repeatedly stacked on a substrate;
  sequentially forming a first lower layer and a first photoresist pattern on the stack structure;
  etching the first lower layer using the first photoresist pattern as an etch mask to form a first lower pattern; and
  etching a first part of the stack structure to form a stepwise structure using the first lower pattern as an etch mask by repeatedly trimming a width of the first lower mask pattern to form the stepwise structure,
  wherein the first lower layer includes a novolac-based organic polymer,
  wherein the first photoresist pattern includes a polymer that includes a unit represented by the following chemical formula 5,

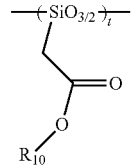

[chemical formula 5]

wherein "$R_{10}$" represents hydrogen, C1-C10 alkyl group, C1-C10 alkenyl group, C1-C10 alkynyl group, C6-C10 aryl group, adamantyl group, C1-C5 alkyl-adamantyl group, or C2-C6 lactone group, and "t" is an integral number of 1 to 10, and
  wherein the polymer has an average molecular weight of 1,000 to 100,000.

2. The method of claim 1, wherein a content of silicon ranges from 10 wt % to 40 wt % in the first photoresist pattern.

3. The method of claim 1, wherein the first lower layer further includes a cross-linker comprising a compound represented by the following chemical formula 1,

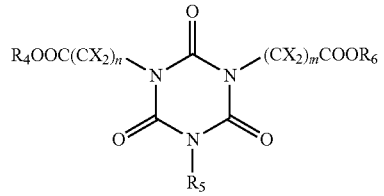

[chemical formula 1]

wherein at least two of R$_4$OOC(CX$_2$)$_n$—, R$_5$—, and R$_6$OOC(CX$_2$)$_m$— are different acids or different ester groups, each of "R$_4$," "R$_5$," "R$_6$," and "X" independently represents a hydrogen or a non-hydrogen substituent, and each of "n" and "m" is an integral number greater than 0, and wherein the non-hydrogen substituent is a substituted or unsubstituted C1-C10 alkyl group, a substituted or unsubstituted C2-C10 alkenyl or C2-C10 alkynyl group, a substituted or unsubstituted C1-C10 alkanoyl group, a substituted or unsubstituted C1-C10 alkoxy group, an epoxy group, a substituted or unsubstituted C1-C10 alkylthio group, a substituted or unsubstituted C1-C10 alkylsulphinyl group, a substituted or unsubstituted C1-C10 alkylsulfonyl group, a substituted or unsubstituted carboxyl group, a substituted or unsubstituted —COO—(C1-C8 alkyl), a substituted or unsubstituted C6-C12 aryl group, or a substituted or unsubstituted 5- to 10-membered heteroalicyclic or heteroaryl group.

4. The method of claim 1, wherein forming the stepwise structure comprises repeating a process cycle,
wherein the process cycle comprises:
etching at least one of the insulating layers exposed by the first lower pattern using the first lower pattern as an etch mask;
etching at least one of the sacrificial layers under the at least one of the insulating layers; and
trimming the first lower pattern to reduce a width and a height of the first lower pattern.

5. The method of claim 4, wherein the trimming of the first lower pattern comprises:
reducing the width by a first length; and
reducing the height by a second length,
wherein the second length is greater than the first length and smaller than 1.5 times the first length.

6. The method of claim 4, wherein the process cycle is repeated until a lowermost insulating layer and a lowermost sacrificial layer of the stack structure are etched.

7. The method of claim 1, wherein the substrate includes a cell array region, a second contact region adjacent to the cell array region, and a first contact region spaced apart from the cell array region with the second contact region disposed between the cell array region and the first contact region,
wherein the etched first part of the stack structure is disposed in the second contact region,
the method for manufacturing the semiconductor device further comprising:
forming a second lower pattern including a novolac-based organic polymer on the stack structure; and
etching the stack structure in the first contact region using the second lower pattern as an etch mask to form the stepwise structure in the first contact region.

8. The method of claim 1, wherein the substrate includes a cell array region, a second contact region adjacent to the cell array region, and a first contact region spaced apart from the cell array region with the second contact region disposed between the cell array region and the first contact region,
wherein the etched first part of the stack structure is disposed in the second contact region,
the method for manufacturing the semiconductor device further comprising:
forming a second photoresist pattern on the stack structure; and
etching the stack structure in the first contact region using the second photoresist pattern as an etch mask to form the stepwise structure in the first contact region by repeatedly trimming a width of the second photoresist pattern to form the stepwise structure in the first contact region, wherein the second photoresist pattern comprises a copolymer including a plurality of units represented by the following chemical formulas 2 and 3 and optionally a plurality of units represented by the following chemical formula 4,

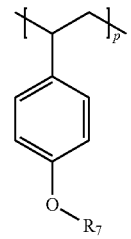
[chemical formula 2]

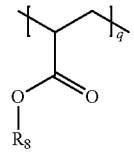
[chemical formula 3]

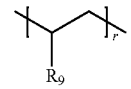
[chemical formula 4]

wherein each of "R$_7$", "R$_8$", and "R$_9$" independently represents hydrogen, C1-C20 hydrocarbyl group, or C1-C20 hydrocarbyl group substituted with a group represented by —O—R$_{11}$, "R$_{11}$" is C1-C10 alkyl, C2-C10 alkenyl, C2-C10 alkynyl, C6-C10 aryl or C3-C10 cycloalkyl, "p" is an integral number of from 1 to 10, "q" is an integral number of from 1 to 10, and "r" is an integral number of from 1 to 10, and
wherein the copolymer has a weight average molecular weight of 1,000 to 100,000.

9. The method of claim 1, further comprising:
forming channel holes that penetrate the stack structure to expose the substrate; and
forming a gate insulating layer and a channel layer that are sequentially stacked on an inner sidewall of each of the channel holes.

10. The method of claim 1, further comprising:
selectively removing the sacrificial layers to form recess regions between the insulating layers; and
forming gate electrodes filling the recess regions, respectively.

11. The method of claim 10, wherein end portions of the gate electrodes correspond to the stepwise structure of end portions of the sacrificial layers,
the method for manufacturing the semiconductor device further comprising:
forming a contact plug that penetrates an end portion of at least one of the insulating layers, wherein the contact plug is electrically connected to the end portion of at least one of the gate electrodes.

12. The method of claim 1, wherein the first photoresist pattern is completely removed during the etching the first lower layer using the first photoresist pattern as the etch mask to form the first lower pattern.

13. A method for manufacturing a semiconductor device, the method comprising:
  forming a stack structure including insulating layers and sacrificial layers which are alternately and repeatedly stacked on a substrate;
  forming an organic polymer layer on the stack structure;
  forming a photoresist layer comprising silicon on the organic polymer layer;
  exposing and developing the photoresist layer to form a photoresist pattern;
  etching the organic polymer layer using the photoresist pattern as an etch mask to form an organic polymer pattern; and
  etching the stack structure using the organic polymer pattern as an etch mask to form a stepwise structure by repeatedly trimming a width of the organic polymer pattern to form the stepwise structure,
  wherein a thickness of the organic polymer layer ranges from 10 times to 30 times a thickness of the photoresist layer,
  wherein the photoresist layer includes a polymer having a unit represented by the following chemical formula 5,

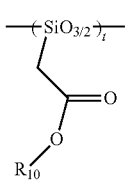

[chemical formula 5]

wherein "$R_{10}$" represents hydrogen, C1-C10 alkyl group, C1-C10 alkenyl group, C1-C10 alkynyl group, C6-C10 aryl group, adamantyl group, C1-C5 alkyl-adamantyl group, or C2-C6 lactone group, and "t" is an integral number of 1 to 10 and
  wherein the polymer has an average molecular weight of 1,000 to 100,000.

14. The method of claim 13, wherein the organic polymer layer includes a novolac-based polymer.

15. The method of claim 13, wherein the photoresist pattern is completely removed during the etching the organic polymer layer using the photoresist pattern as the etch mask to form the organic polymer pattern.

16. A method for manufacturing a semiconductor device, the method comprising:
  forming an organic polymer layer on an etch target layer disposed on a substrate;
  forming a photoresist layer comprising silicon on the organic polymer layer,
  wherein the photoresist layer comprises a polymer having a unit represented by the following chemical formula 5,

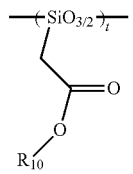

[chemical formula 5]

wherein "$R_{10}$" represents hydrogen, C1-C10 alkyl group, C1-C10 alkenyl group, C1-C10 alkynyl group, C6-C10 aryl group, adamantyl group, C1-C5 alkyl-adamantyl group, or C2-C6 lactone group, and "t" is an integral number of 1 to 10, and
  wherein the polymer has a weight average molecular weight of 1,000 to 100,000; and
  etching the organic polymer layer using the photoresist layer as an etch mask to form an organic polymer pattern; and
  etching the etch target layer using the organic polymer pattern as an etch mask to form a stepwise structure by repeatedly trimming a width of the organic polymer pattern to form the stepwise structure.

17. The method of claim 16, wherein a thickness of the organic polymer layer ranges from 10 times to 30 times a thickness of the photoresist layer.

18. The method of claim 16, wherein the organic polymer layer includes a novolac-based polymer.

19. The method of claim 16, wherein the organic polymer layer includes a cross-linker comprising a compound represented by the following chemical formula 1,

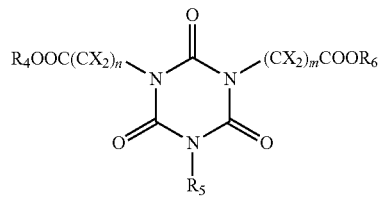

[chemical formula 1]

wherein at least two of $R_4OOC(CX_2)_n$—, $R_5$—, and $R_6OOC(CX_2)_m$— are different acids or different ester groups, each of "$R_4$," "$R_5$," "$R_6$," and "X" independently represents a hydrogen or a non-hydrogen substituent, and each of "n" and "m" is an integral number greater than 0.

20. The method of claim 16, wherein the photoresist layer is completely removed during the etching the organic polymer layer using the photoresist layer as the etch mask to form the organic polymer pattern.

* * * * *